(12) United States Patent
Hsiao et al.

(10) Patent No.: US 9,812,521 B2
(45) Date of Patent: Nov. 7, 2017

(54) EMBEDDED PASSIVE CHIP DEVICE AND METHOD OF MAKING THE SAME

(71) Applicant: Wafer Mems Co., LTD., Miaoli County (TW)

(72) Inventors: Min-Ho Hsiao, Miaoli County (TW); Pang-Yen Lee, Miaoli County (TW); Yen-Hao Tseng, Miaoli County (TW)

(73) Assignee: WAFER MEMS CO., LTD., Jhunan Township, Miaoli County (TW)

( * ) Notice: Subject to any disclaimer, the term of this patent is extended or adjusted under 35 U.S.C. 154(b) by 0 days.

(21) Appl. No.: 15/152,877

(22) Filed: May 12, 2016

(65) Prior Publication Data
US 2016/0380041 A1 Dec. 29, 2016

(30) Foreign Application Priority Data
Jun. 25, 2015 (TW) .............................. 104120532 A

(51) Int. Cl.
| | | |
|---|---|---|
| *H01L 21/326* | (2006.01) | |
| *H01L 49/02* | (2006.01) | |
| *H01L 21/768* | (2006.01) | |
| *H01L 21/78* | (2006.01) | |
| *H01F 41/04* | (2006.01) | |
| *H01L 23/64* | (2006.01) | |

(52) U.S. Cl.
CPC .............. *H01L 28/10* (2013.01); *H01F 41/04* (2013.01); *H01L 21/76873* (2013.01); *H01L 21/78* (2013.01); *H01L 23/645* (2013.01)

(58) Field of Classification Search
CPC .......................... H01L 28/10; H01L 21/76871
USPC ........................................... 257/531; 438/467
See application file for complete search history.

(56) References Cited

U.S. PATENT DOCUMENTS

| | | | |
|---|---|---|---|
| 9,171,794 B2* | 10/2015 | Rafferty | ............... H01L 23/4985 |
| 9,318,455 B2* | 4/2016 | Lin | .......................... H01L 24/11 |
| 2010/0035382 A1* | 2/2010 | Fjelstad | ............... H01L 23/3114 438/113 |
| 2013/0134581 A1* | 5/2013 | Lin | ....................... H01L 21/563 257/737 |
| 2016/0276173 A1* | 9/2016 | Song | ................. H01L 23/49816 |
| 2016/0379748 A1* | 12/2016 | Hsiao | .................. H01F 17/0006 336/200 |

(Continued)

FOREIGN PATENT DOCUMENTS

| | | |
|---|---|---|
| CN | 103871724 A | 6/2014 |
| TW | 201216303 A1 | 4/2012 |

OTHER PUBLICATIONS

Search Report in TW Patent Application No. 104120532 dated Feb. 2, 2017, with English translation. 2 pages.

*Primary Examiner* — Jami M Valentine
(74) *Attorney, Agent, or Firm* — Blakely Sokoloff Taylor & Zafman LLP

(57) ABSTRACT

An embedded passive chip device includes a chip body and a functional layered structure. The chip body has a circuit-forming surface that is formed with a recess. The functional layered structure is formed on the chip body and includes a conductive layer that has at least a portion which covers at least partially the circuit-forming surface, and a magnetic layer that is disposed within the recess and that is inductively coupled to the conductive layer for generating inductance. A method of making the embedded passive chip device is also disclosed.

6 Claims, 32 Drawing Sheets

(56) References Cited

U.S. PATENT DOCUMENTS

2016/0379749 A1* 12/2016 Hsiao .................... H01F 41/042
  336/200
2016/0380041 A1* 12/2016 Hsiao ...................... H01L 28/10
  257/531

* cited by examiner

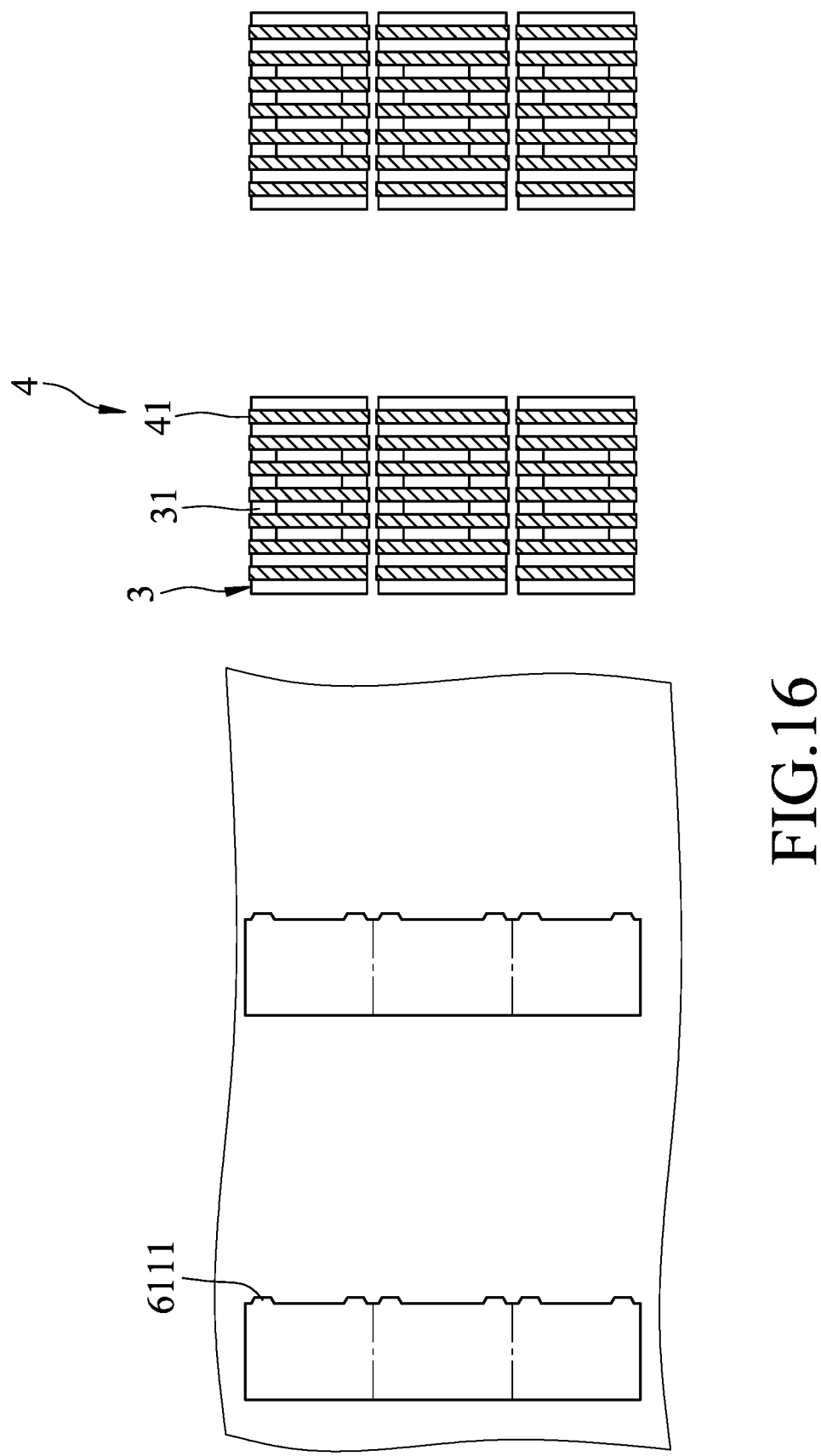

EMBEDDED PASSIVE CHIP DEVICE AND METHOD OF MAKING THE SAME

CROSS-REFERENCE TO RELATED APPLICATION

This application claims priority of Taiwanese Application No. 104120532, filed on Jun. 25, 2015.

FIELD

The disclosure relates to a passive chip device and a method of making the same, more particularly to an embedded passive chip device and a method of making the same.

BACKGROUND

A passive device is referred to as a circuit device that is not capable of providing power gain. A capacitor, an inductor, and a resistor are all considered as passive devices for mainly filtering or blocking higher-frequency alternating current (AC). For example, a magnetic-core inductor that has a coil wound on a magnetic core may used as a choke or a common mode filter, and an assembly of a magnetic-core inductor and a capacitor that are electro-connected to each other may be used as an LC filter.

There are three types of commercially available inductors, namely thin film type inductors, multilayered type inductors, and wire wound type inductors.

TW patent application publication No. 201440090 A discloses a multilayered type inductor (see FIG. 1) and a method of making the same.

The method of making the multilayered type inductor includes the steps of: laminating a first circuit plate 110, a second circuit plate 120, a third circuit plate 130 and a fourth circuit plate 140 (see FIG. 2A); attaching an assembly of a supporting film 150 and a bonding pad circuit 160 to the first circuit plate 110 (see FIG. 2B); transferring the bonding pad circuit 160 from the supporting film 150 to the first circuit plate 110 (see FIG. 2C); removing the supporting film 150 from the bonding pad circuit 160 (see FIG. 2D); sintering the first, second, third and fourth circuit plates 110, 120, 130, 140 and the bonding pad circuit 160 so as to form a multilayered circuit substrate 100 (see FIG. 2E); and scribing the multilayered circuit substrate 100 using a scriber 170 (see FIG. 2F), so that the multilayered circuit substrate 100 can be broken into a plurality of multilayered type inductors 10 (see FIG. 1).

Referring to FIG. 1, each of the first, second, third and fourth circuit plates 110, 120, 130, 140 includes a respective one of non-magnetic bodies 111, 121, 131, 141 and a respective one of first, second, third and fourth circuit patterns 112, 122, 132, 142. Formation of the first, second, third and fourth circuit plates 110, 120, 130, 140 requires numerous steps (a total of at least 13 steps), including punching each non-magnetic body 111, 121, 131, 141 to form holes, filling the conductive paste in the holes, forming the first, second, third and fourth circuit patterns 112, 122, 132, 142 and sintering before laminating the first, second, third and fourth circuit plates 110, 120, 130, 140.

The conventional method may tend to cause undesired non-ohmic contact and Joule-heating generated at the interfaces between every two adjacent ones of the first, second, third and fourth circuit patterns 112, 122, 132, 142.

In order to prevent the undesired non-ohmic contact and Joule-heating and reduce the steps of the method of making the multilayered type inductor, TW patent No. 554355 discloses an improved chip inductor and a method of making the same.

Referring to FIGS. 3 and 4, the method of making the improved chip inductor includes the steps of: providing a ceramic substrate 200 which has a thickness of 150 µm; laminating on the ceramic substrate 200 a first circuit layer 210 with a predetermined pattern (such as a spiral coil), a first insulator layer 220 of polyimide (PI), a second circuit layer 230 with a predetermined pattern, a second insulator layer 240 of polyimide, and a third insulator layer 250 which is made from a PI-based material containing inorganic additives, such as Co, Fe, and Mn, so as to form a semi-product; heating the first and second circuit layers 210, 230 and the first, second and third insulator layers 220, 240, 250; forming a plurality of scribing lines (not shown) with a grid pattern on the third insulator layer 250 using a laser beam; and breaking the first and second circuit layers 210, 230 and the first, second and third insulator layers 220, 240, 250 along the scribing lines using a roller so as to form a plurality of chip inductors 2. The total thickness of the first circuit layer 210 and the first insulator layer 220 is 20 µm. The total thickness of the second circuit layer 230 and the second insulator layer 240 is 20 µm. The third insulator layer 250 has a thickness ranging from 20 µm to 30 µm.

Since the size of the aforesaid chip inductor 2 is 1 mm×0.5 mm or 0.6 mm×0.3 mm, it is too big to be used in a thin and small electronic device, such as a cellular phone.

SUMMARY

Therefore, an object of the disclosure is to provide an embedded passive chip device that can alleviate at least one of the drawbacks of the prior arts.

According to the disclosure, the embedded passive chip device includes a chip body and a functional layered structure.

The chip body has a circuit-forming surface that is formed with a recess.

The functional layered structure is formed on the chip body, and includes a conductive layer that has at least a portion which covers at least partially the circuit-forming surface, and a magnetic layer that is disposed within the recess and that is inductively coupled to the conductive layer for generating inductance.

Another object of the disclosure is to provide a method of making an embedded passive chip device that can overcome the aforesaid drawbacks of the prior art.

According to the disclosure, the method of making the embedded passive chip device includes: forming a patterned wafer which has a peripheral end portion and at least one passive-component unit that includes a connecting portion, a breaking line, and a plurality of spaced apart chip bodies, the connecting portion being connected to the peripheral end portion, the breaking line having a plurality of connecting tabs that are spaced apart from one another, each of the connecting tabs being disposed between and interconnecting the connecting portion and a respective one of the chip bodies, each of the chip bodies having a circuit-forming surface that is formed with a recess; forming a functional layered structure on each of the chip bodies, the functional layered structure including a conductive layer that has at least a portion which covers at least partially the circuit-forming surface, and a magnetic layer that is disposed within the recess and that is inductively coupled to the conductive layer for generating inductance; and breaking the patterned wafer along the breaking line by applying an external force thereto so as to form a plurality of embedded passive chip devices.

BRIEF DESCRIPTION OF THE DRAWINGS

Other features and advantages of the disclosure will become apparent in the following detailed description of the embodiments with reference to the accompanying drawings, of which:

FIG. 16 is a fragmentary top view illustrating a step of a method of making the first embodiment of the embedded passive chip device according to the disclosure;

DETAILED DESCRIPTION

Figure 1:
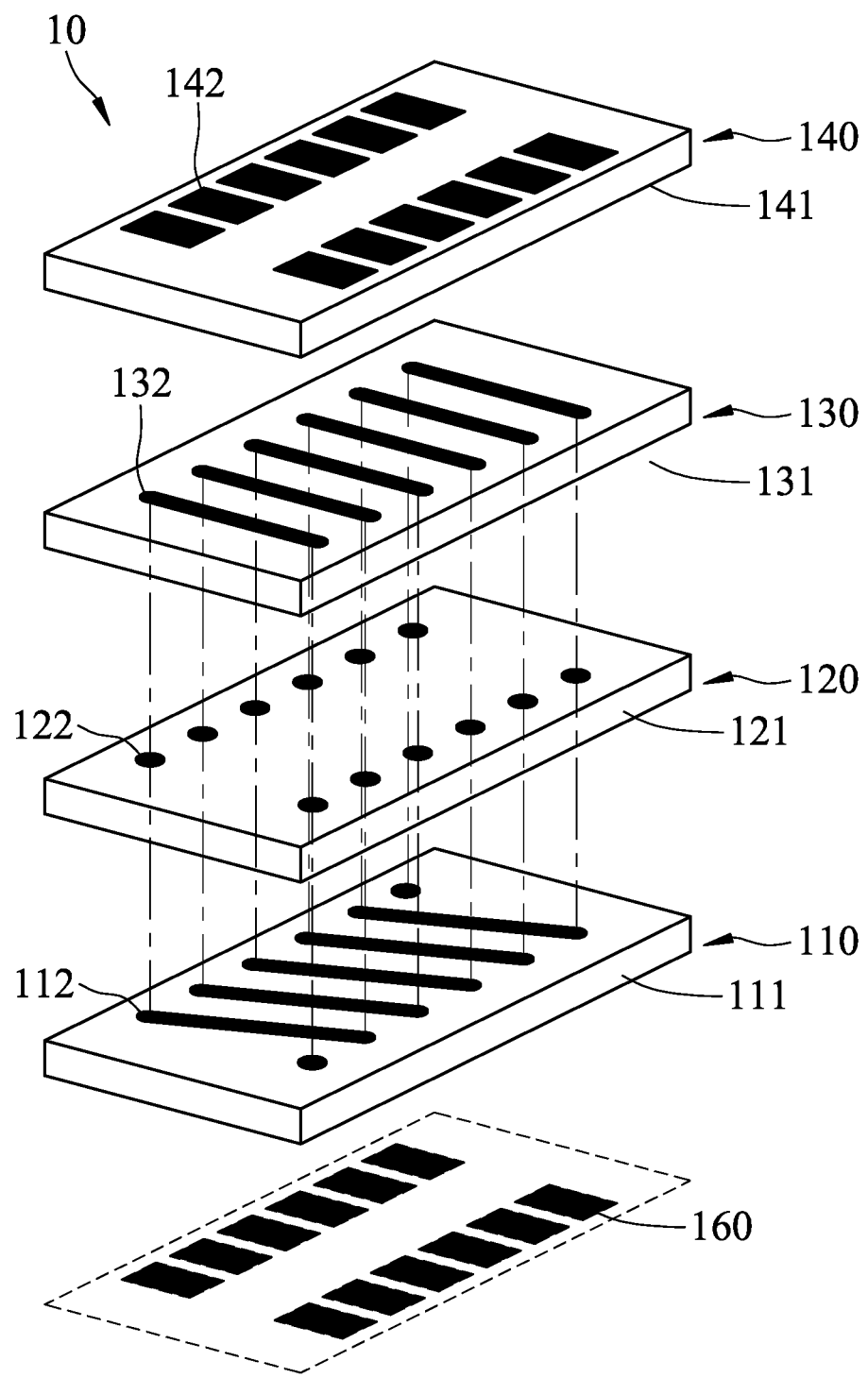
FIG. 1 is an exploded perspective view of a multilayered type inductor disclosed in TW patent application publication No. 201440090 A.
Figure 2A:
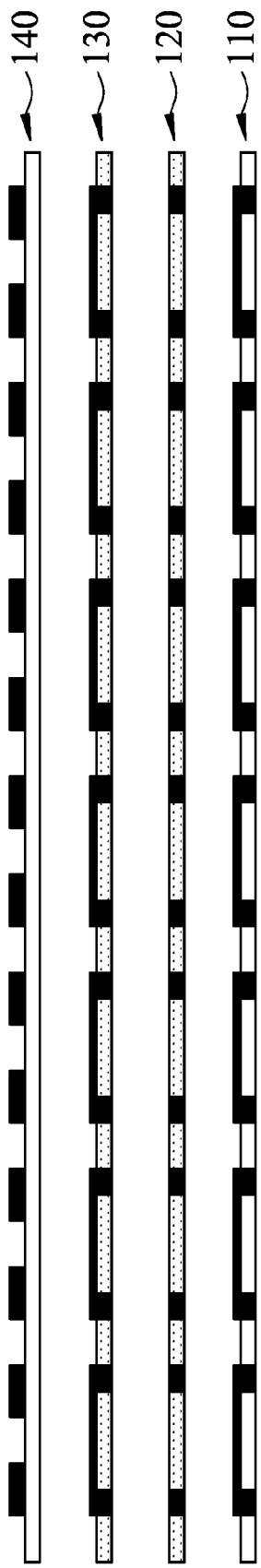
FIGS. 2A to 2F are sectional views illustrating consecutive steps of a method of making the multilayered type inductor of FIG. 1.
Figure 2B:
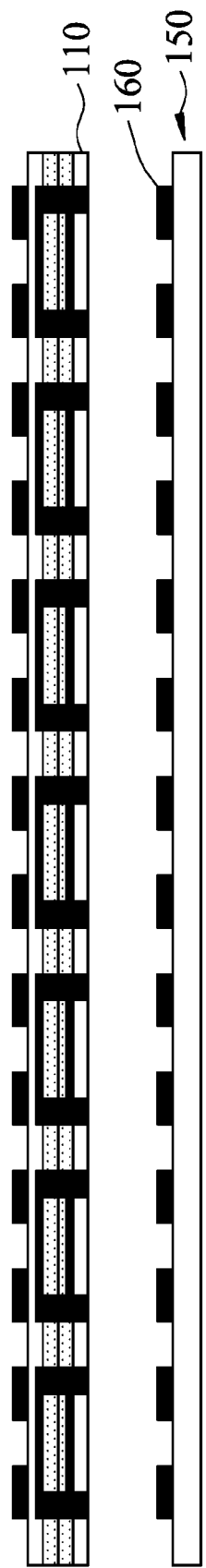
Figure 2C:
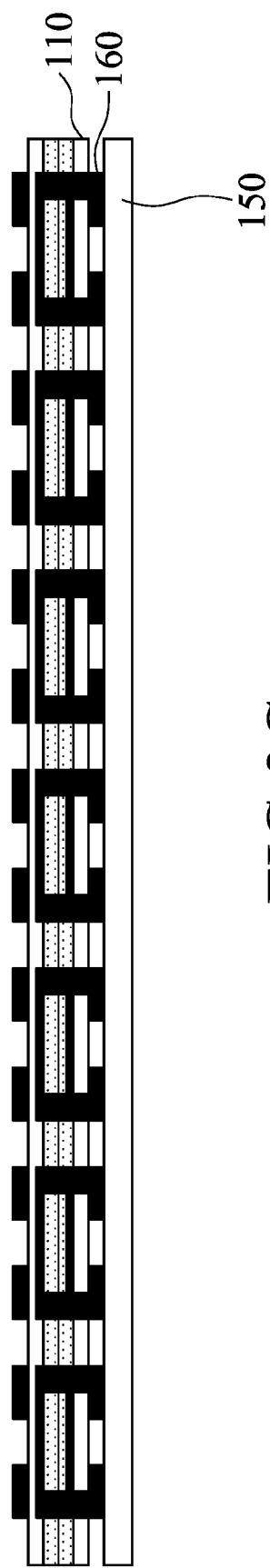
Figure 2D:
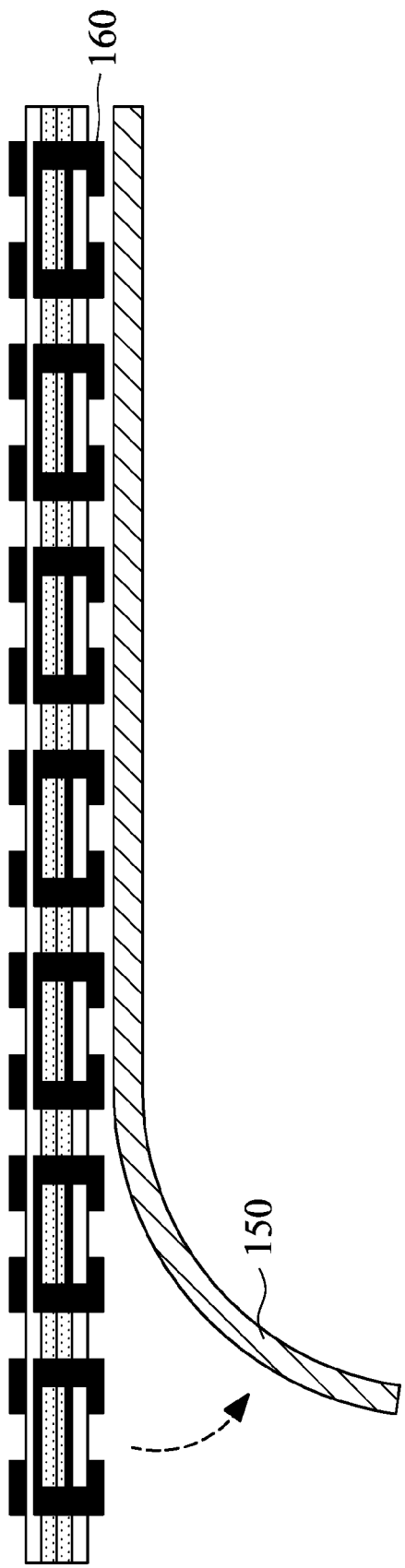
Figure 2E:
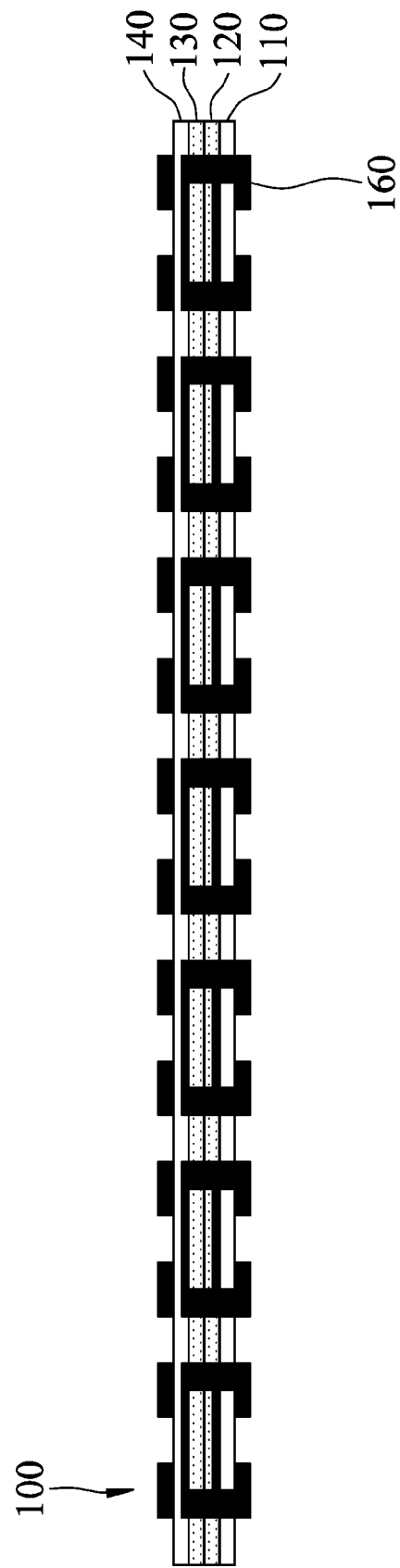
Figure 2F:
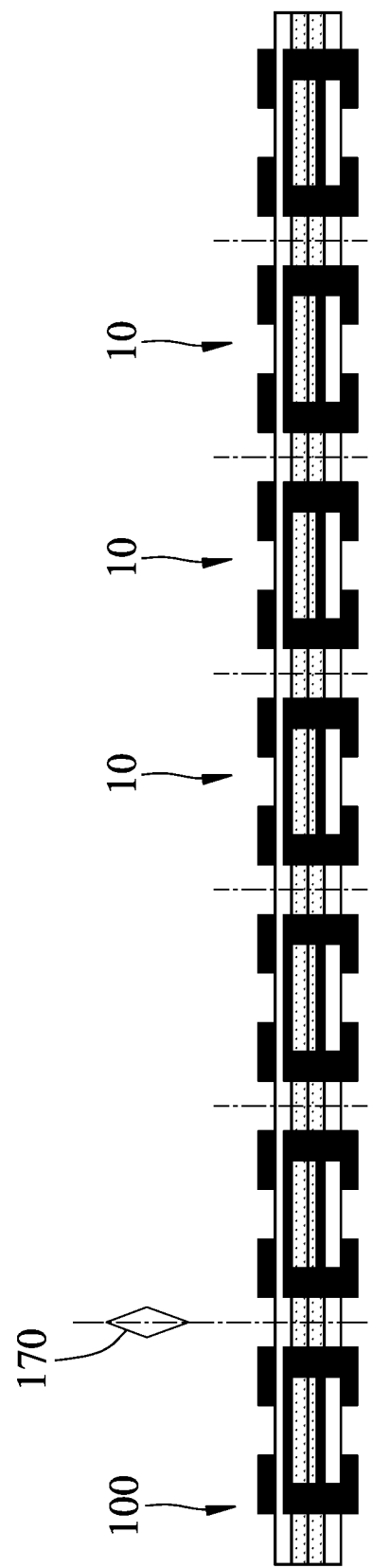
Figure 3:
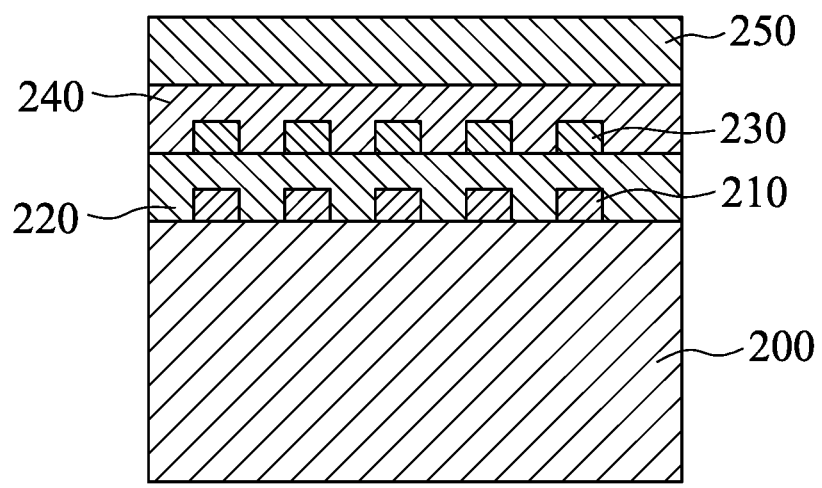
FIG. 3 is a sectional view illustrating a semi-product formed by a method disclosed in TW patent No. 554355.
Figure 4:
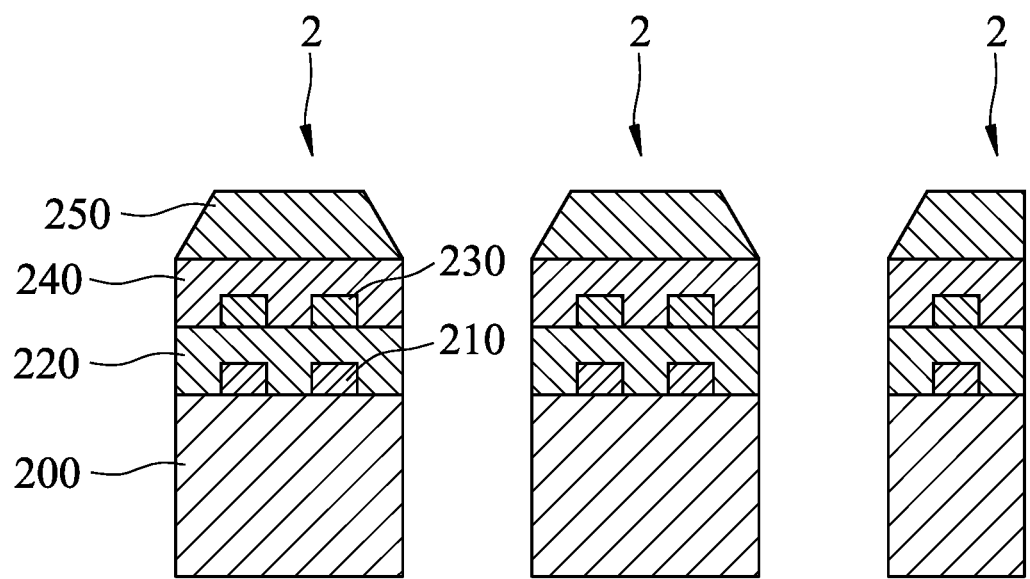
FIG. 4 is a sectional view illustrating inductors disclosed in TW patent No. 554355.

Before the disclosure is described in greater detail, it should be noted that like elements are denoted by the same reference numerals throughout the disclosure.

Figure 5:
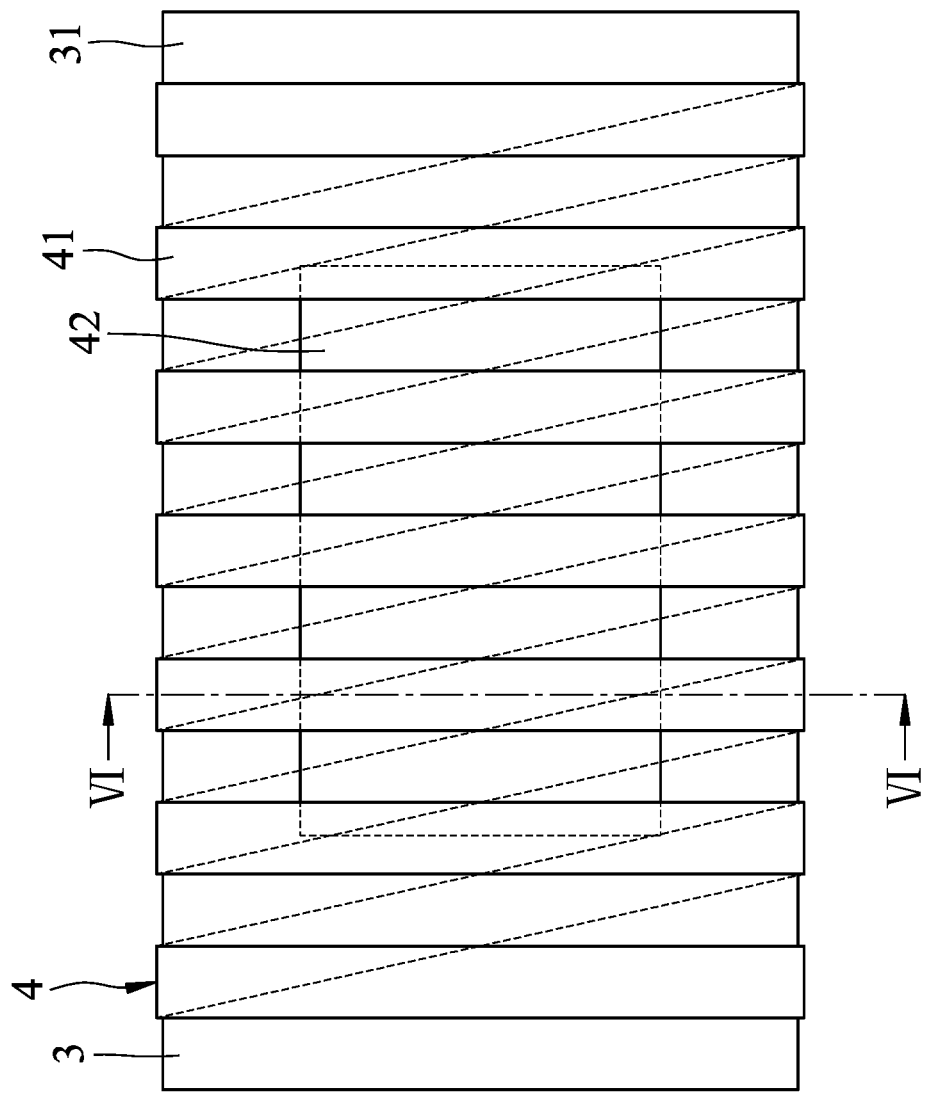
FIG. 5 is a schematic top view of the first embodiment of an embedded passive chip device according to the disclosure.
Figure 6:
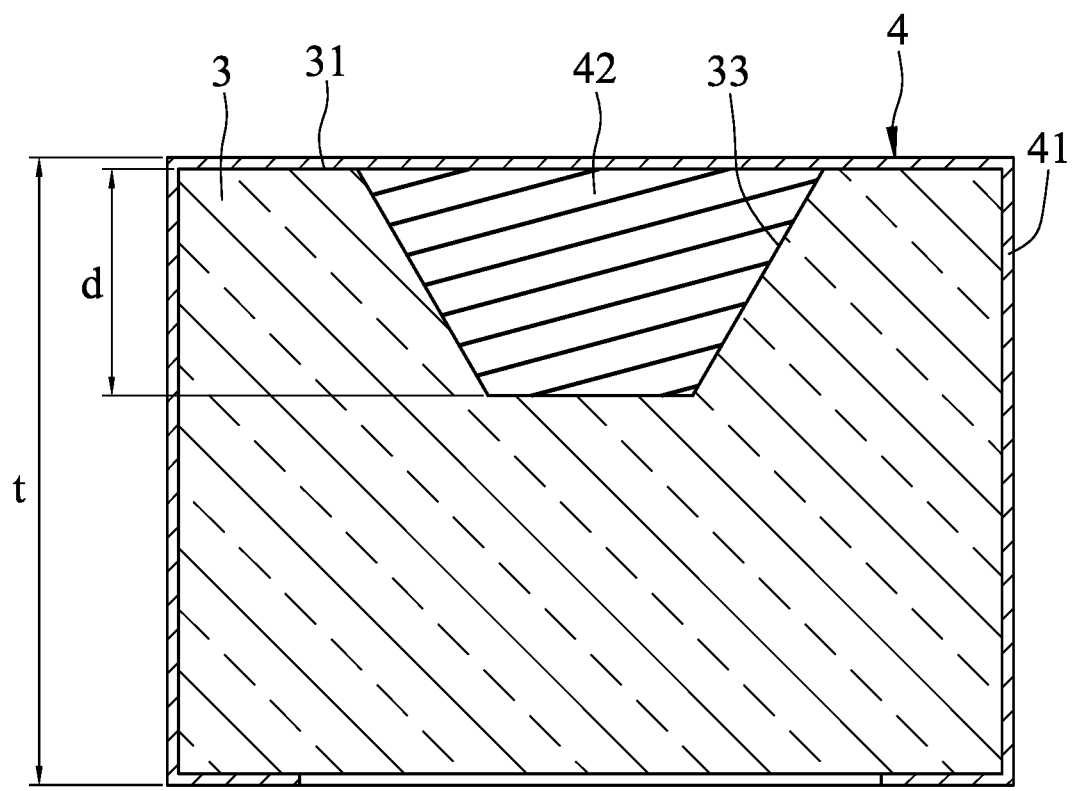
FIG. 6 is a sectional view taken along line VI-VI of FIG. 5.

Referring to FIGS. 5 and 6, the first embodiment of an embedded passive chip device includes a chip body 3 and a first functional layered structure 4.

The chip body 3 has a first circuit-forming surface 31 that is formed with a first recess 33.

The first functional layered structure 4 is formed on the chip body 3, and includes a first conductive layer 41 that has at least a portion which covers at least partially the first circuit-forming surface 31, and a first magnetic layer 42 that is disposed within the first recess 33 and that is inductively coupled to the first conductive layer 41 for generating inductance.

Preferably, the chip body 3 is made from a Si-based material or metal. Examples of the Si-based material may include quartz, silicon wafer, SiC and $Si_3N_4$. The chip body 3 is in the form of a single piece, so as to have an excellent mechanical strength. The chip body 3 may be formed by etching a bulk, such as a quartz wafer or a Si wafer.

It is noted that the chip body 3 may have a size ranging from a micrometer scale to a millimeter scale. The first recess 33 has a depth (d). The chip body 3 has a thickness (t). In certain embodiments, the ratio (d/t) of the depth (d) to the thickness (t) ranges from 0.05 to 0.95 for obtaining desired properties of the first magnetic layer of the first conductive layered structure 4. Preferably, the ratio (d/t) ranges from 0.35 to 0.95. More preferably, the ratio (d/t) ranges from 0.45 to 0.95.

The first conductive layer 41 is in the form of a coil, and is disposed around the chip body 3, such that the first embodiment serves as a choke.

Figure 7:
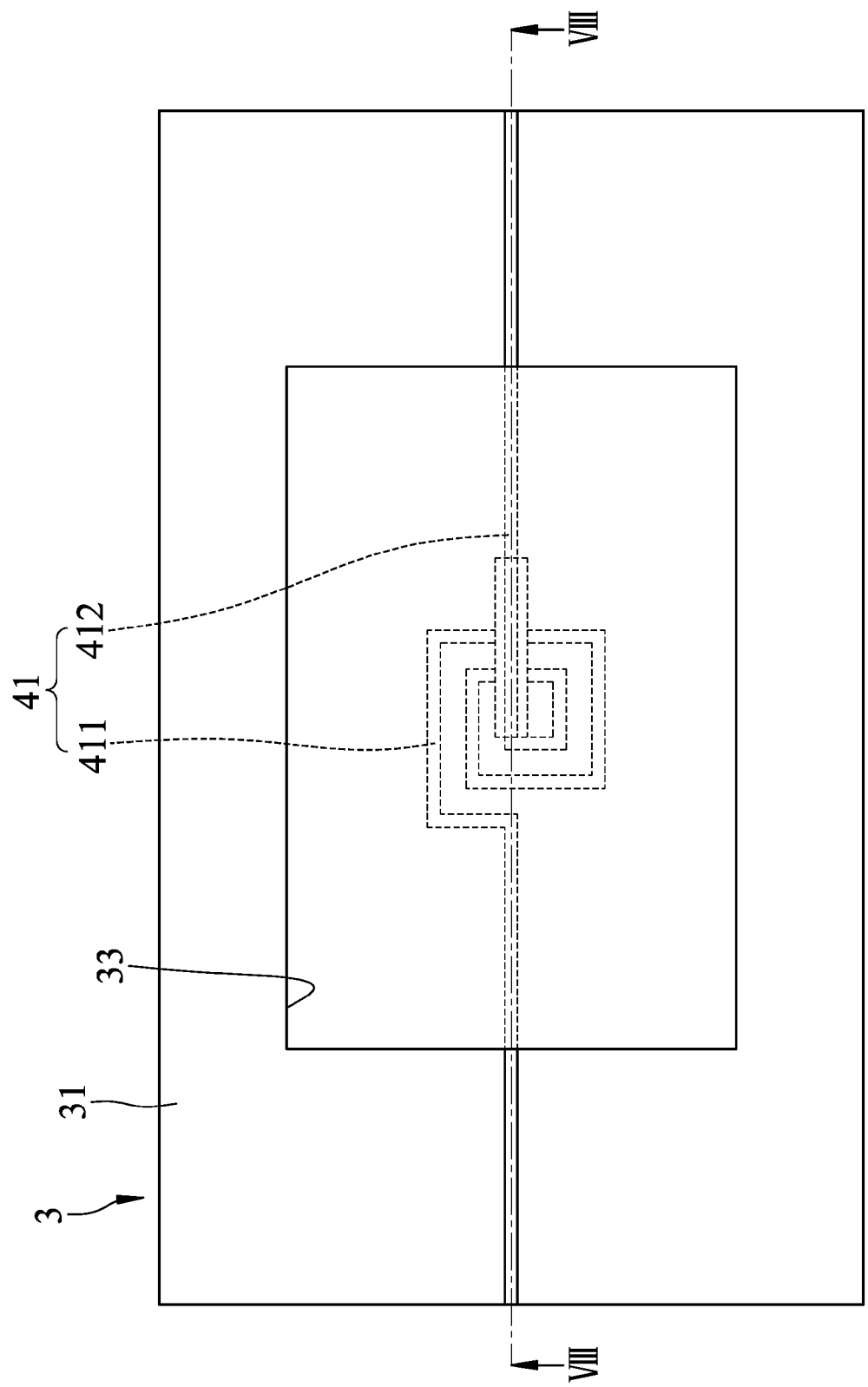
FIG. 7 is a schematic top view of the second embodiment of the embedded passive chip device according to the disclosure.
Figure 8:
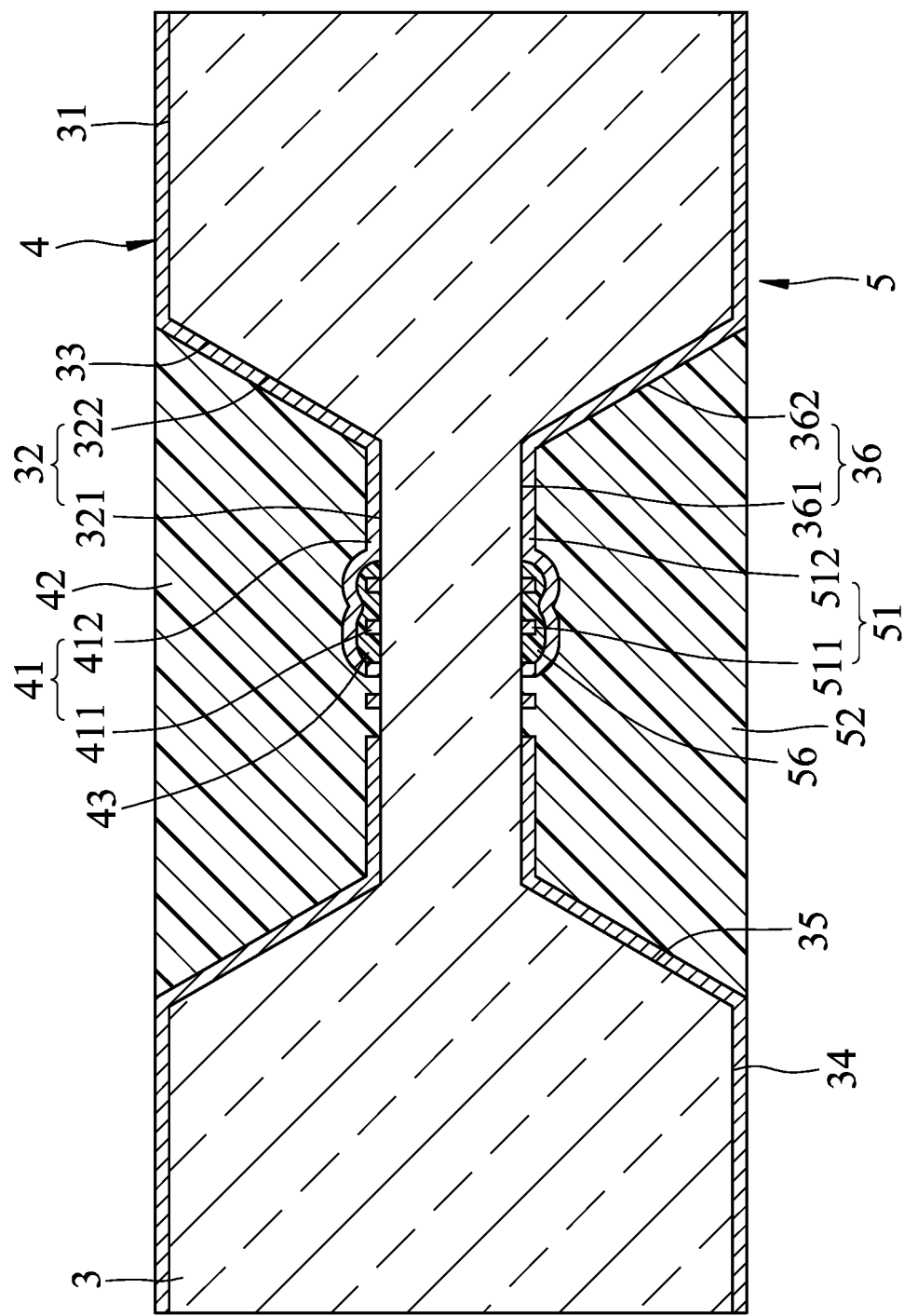
FIG. 8 is a sectional view taken along line VIII-VIII of FIG. 7.

Referring to FIGS. 7 and 8, the second embodiment of the embedded passive chip device differs from the first embodiment in the structure of the first functional layered structure 4. In this embodiment, the first recess 33 is defined by a first recess-defining surface 32 that contacts the first magnetic layer 42 and that has a base portion 321 and a surrounding portion 322 which is disposed between and interconnects the base portion 321 and the first circuit-forming surface 31. The first conductive layer 41 has a spiral part 411 and an extending part 412. The spiral part 411 is formed on the base portion 321, and contacts and is covered by the first magnetic layer 42. The extending part 412 extends from the spiral part 411, and contacts the surrounding portion 322 and the first circuit-forming surface 31. The first functional layered structure 4 further includes an insulator layer 43 that is formed on the base portion 321 and that covers a portion of the spiral part 411. The extending part 412 further extends on the insulator layer 43 for crossing over the portion of the spiral part 411.

The chip body 3 further includes a second circuit-forming surface 34. The second embodiment of the embedded chip device further includes a second functional layered structure 5.

The second circuit-forming surface 34 is opposite to the first circuit-forming surface 31, and is formed with a second recess 35. The second functional layered structure 5 is formed on the chip body 3, and includes a second conductive layer 51 extending on the second circuit-forming surface 34 and a second magnetic layer 52 that is disposed within the second recess 35 and that is inductively coupled to the second conductive layer 51 for generating inductance.

The second recess 35 is defined by a second recess-defining surface 36 that contacts the second magnetic layer 52 and that has a base portion 361 and a surrounding portion 362 which is disposed between and interconnects the base portion 361 and the second circuit-forming surface 34. The second conductive layer 51 has a spiral part 511 and an extending part 512. The spiral part 511 of the second conductive layer 51 is formed on the base portion 361 of the second recess-defining surface 36, and contacts and is covered by the second magnetic layer 52. The extending part 512 of the second conductive layer 51 extends from the spiral part 511 of the second conductive layer 51, and contacts the surrounding portion 362 of the second recess-defining surface 36 and the second circuit-forming surface 34. The second functional layered structure 5 further includes an insulator layer 56 that is formed on the base portion 361 of the second recess-defining surface 36 and that covers a portion of the spiral part 511 of the second conductive layer 51. The extending part 512 of the second conductive layer 51 further extends on the insulator layer 56 of the second functional layered structure 5 for crossing over the portion of the spiral part 511 of the second conductive layer 51.

In the second embodiment, the first and second recesses 33, 35 are symmetrical to each other, and the first and second functional layered structures 4, 5 are symmetrical to each other, such that the second embodiment serves as a common mode filter.

Figure 9:
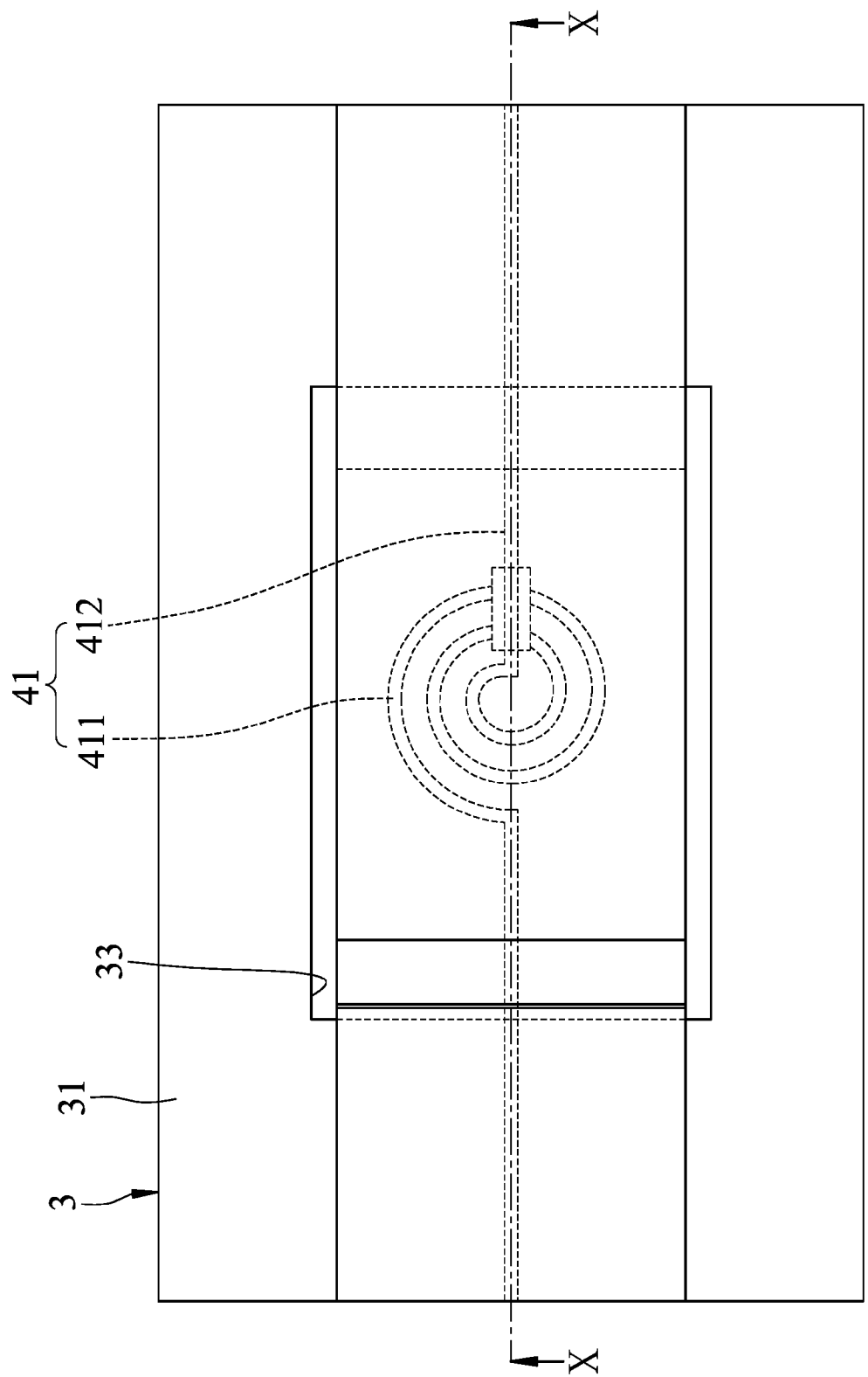
FIG. 9 is a schematic top view of the third embodiment of the embedded passive chip device according to the disclosure.
Figure 10:
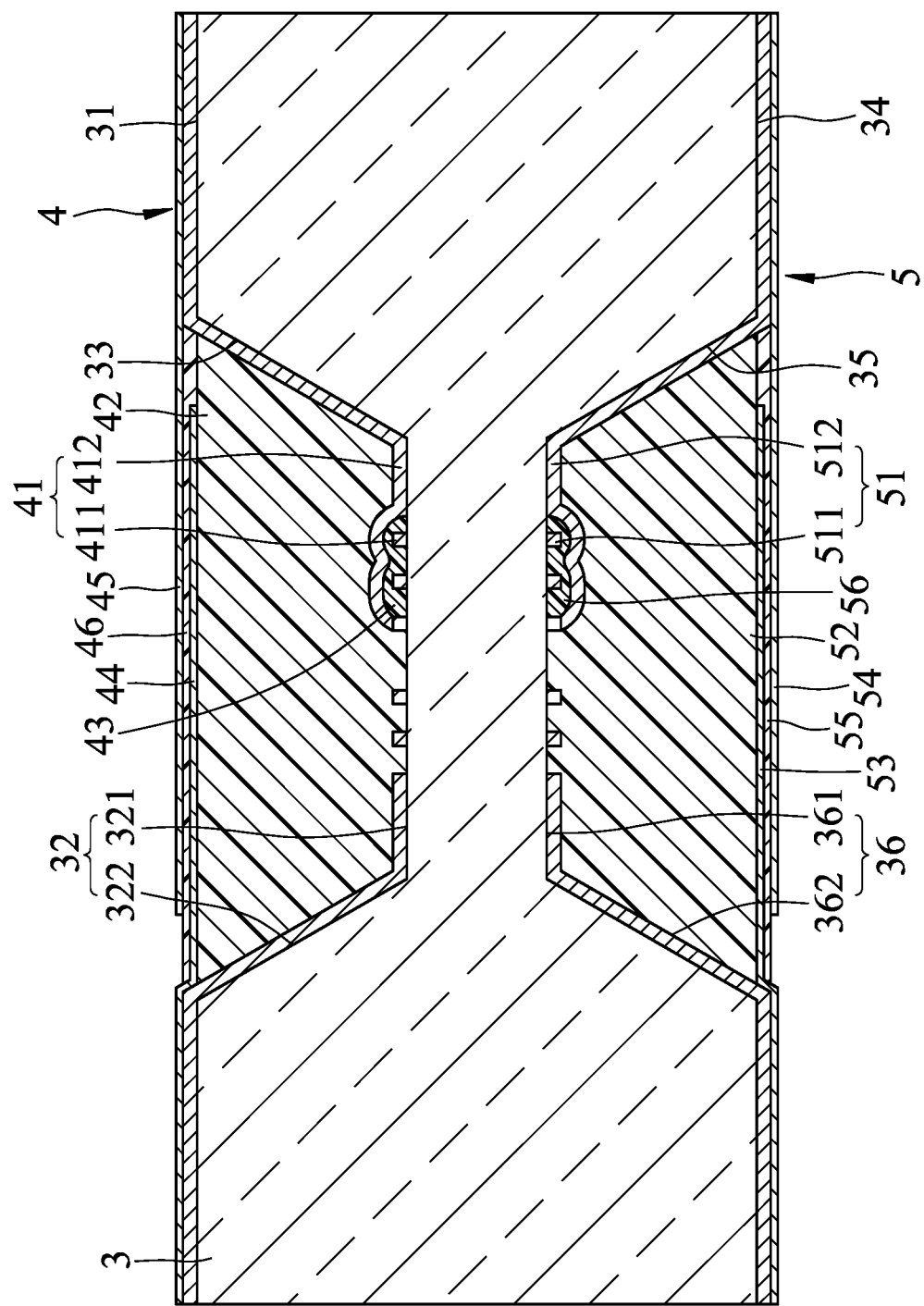
FIG. 10 is a sectional view taken along line X-X of FIG. 9.

Referring to FIGS. 9 and 10, the third embodiment differs from the second embodiment in that the first functional layered structure 4 further includes first and second electrode layers 44, 45 and a first dielectric layer 46. The second functional layered structure 5 further includes third and forth electrode layers 53, 54, and a second dielectric layer 55.

The first and second electrode layers 44, 45 are disposed on the first magnetic layer 42. The first dielectric layer 46 is disposed between the first and second electrode layers 44, 45. The first and second electrode layers 44, 45 and the first dielectric layer 46 cooperatively define a first capacitor. The extending part 412 of the first conductive layer 41 is electro-connected to the first and second electrode layers 44, 45.

The third and fourth electrode layers 53, 54 are disposed on the second magnetic layer 52. The second dielectric layer 55 is disposed between the third and fourth electrode layers 53, 54. The third and fourth electrode layers 53, 54 and the second dielectric layer cooperatively define a second capacitor. The extending part 512 of the second conductive layer 51 is electro-connected to the third and fourth electrode layers 53, 54.

In this embodiment, the first and second functional layered structures 4, 5 are symmetrical to each other, such that the third embodiment may serve as an LC filter.

Figure 11:
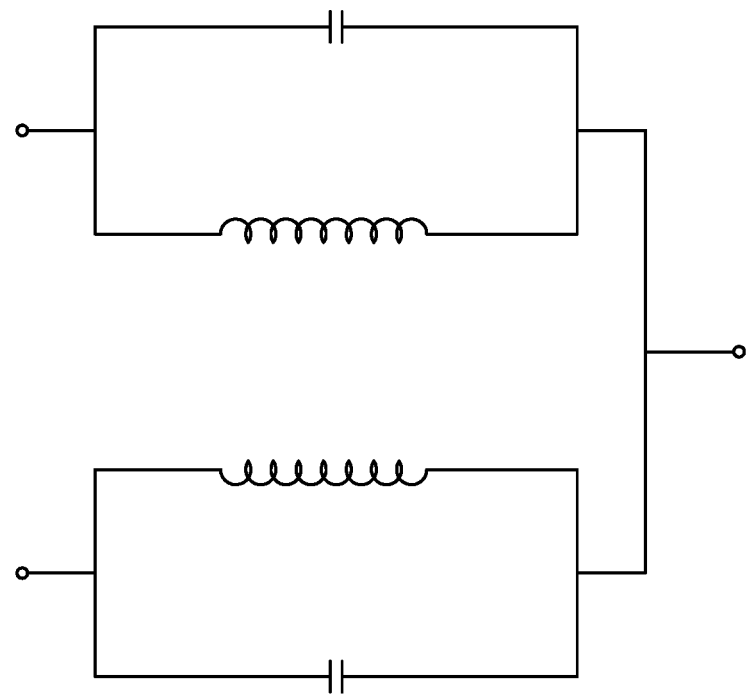
FIG. 11 is an equivalent circuit of the third embodiment.

FIG. 11 illustrates an equivalent circuit of the third embodiment. It shows that each of the first and second functional layered structures 4, 5 (see FIG. 10) forms a capacitor and an inductor which are in parallel connection.

The following description illustrates a method of making the embedded chip device of the first embodiment of the disclosure, and should not be construed as limiting the scope of the disclosure. The method includes the steps of S1 to S3.

Figure 12:
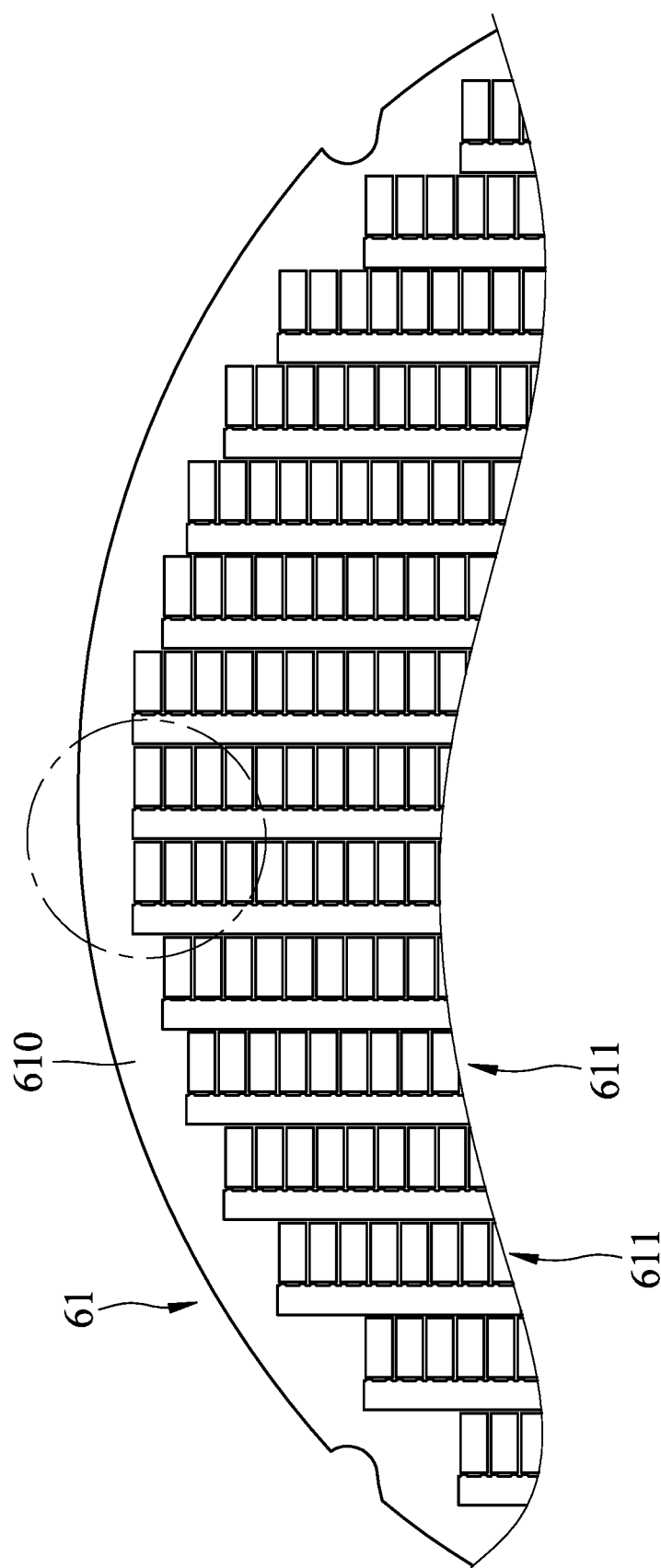
FIG. 12 is a fragmentary top view illustrating a step of a method of making the first embodiment of the embedded passive chip device according to the disclosure.
Figure 13:
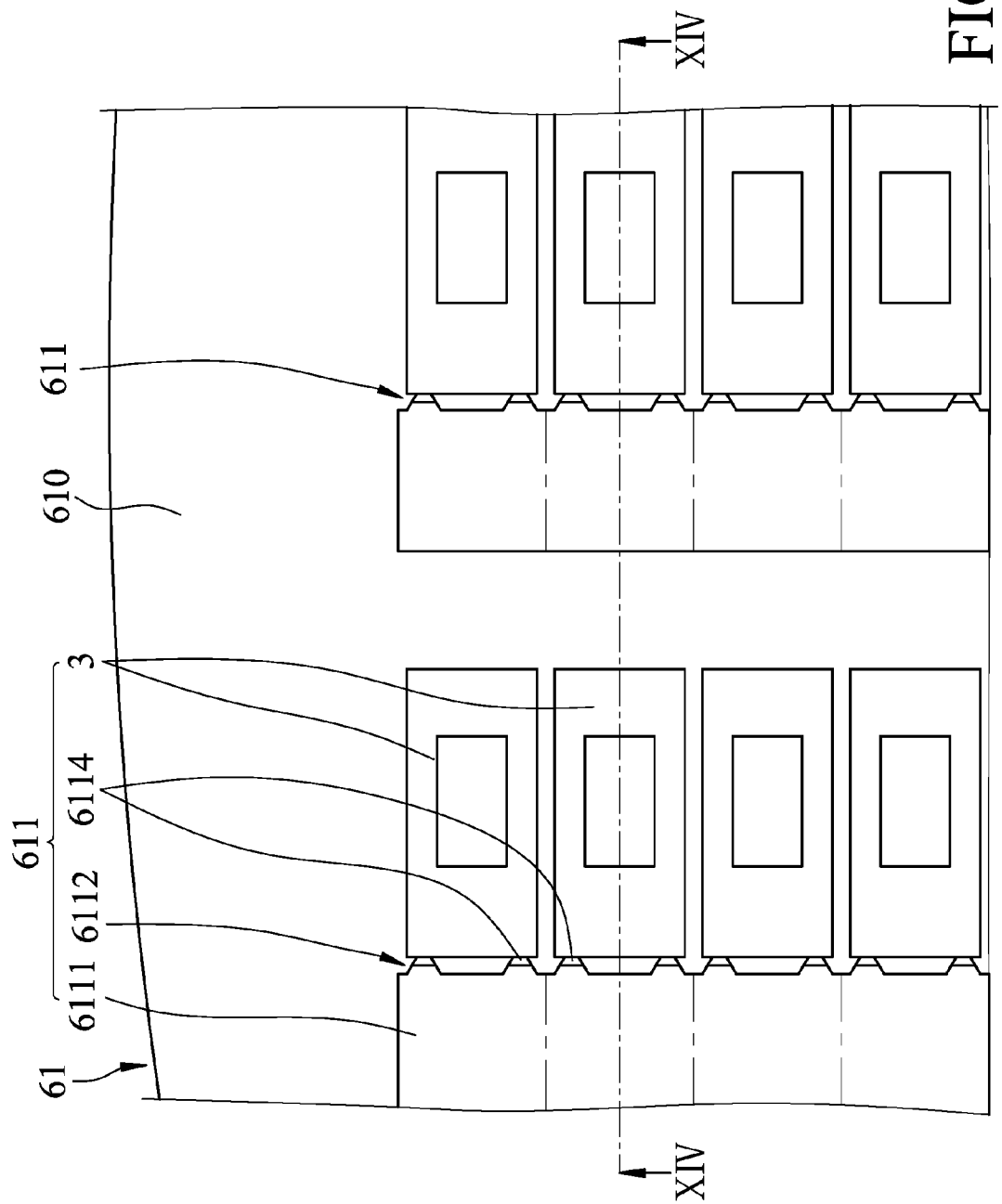
FIG. 13 is an enlarge view of an encircled portion of FIG. 12.
Figure 14:
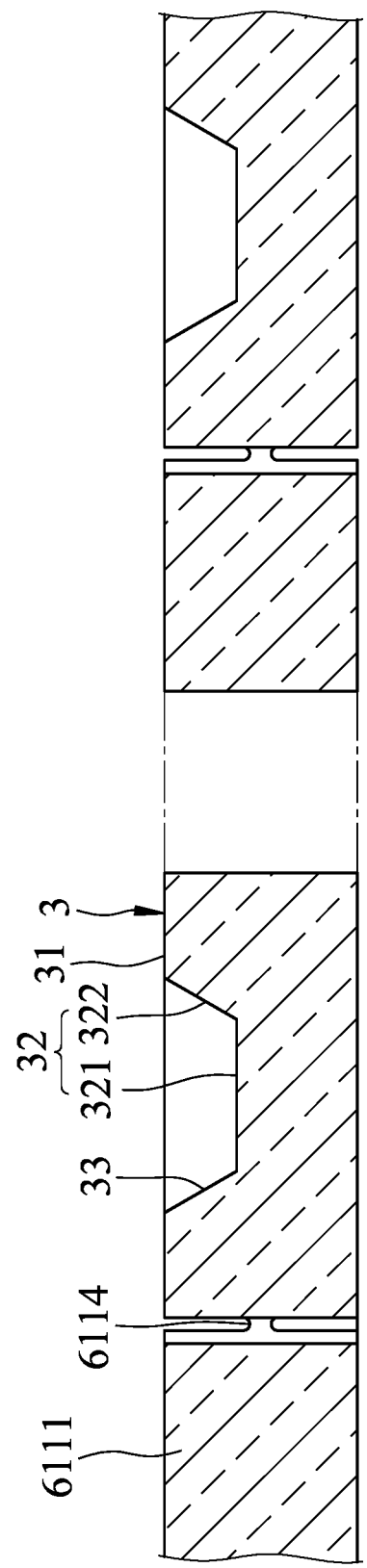
FIG. 14 is a sectional view taken along line XIV-XIV of FIG. 13.
Figure 15A:
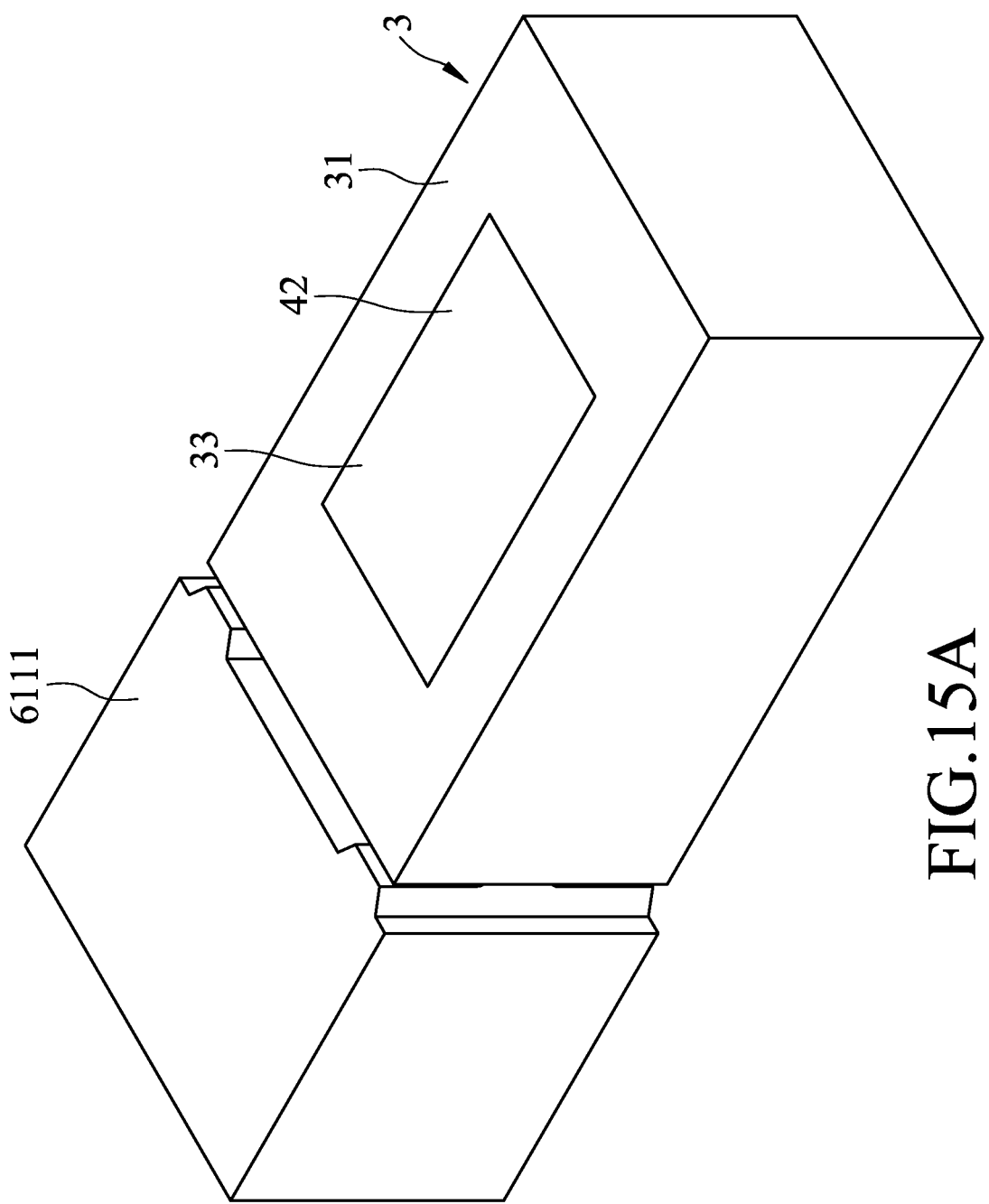
FIGS. 15A to 15E are perspective views illustrating consecutive steps of the method of making the first embodiment of the embedded passive chip device according to the disclosure.
Figure 15B:
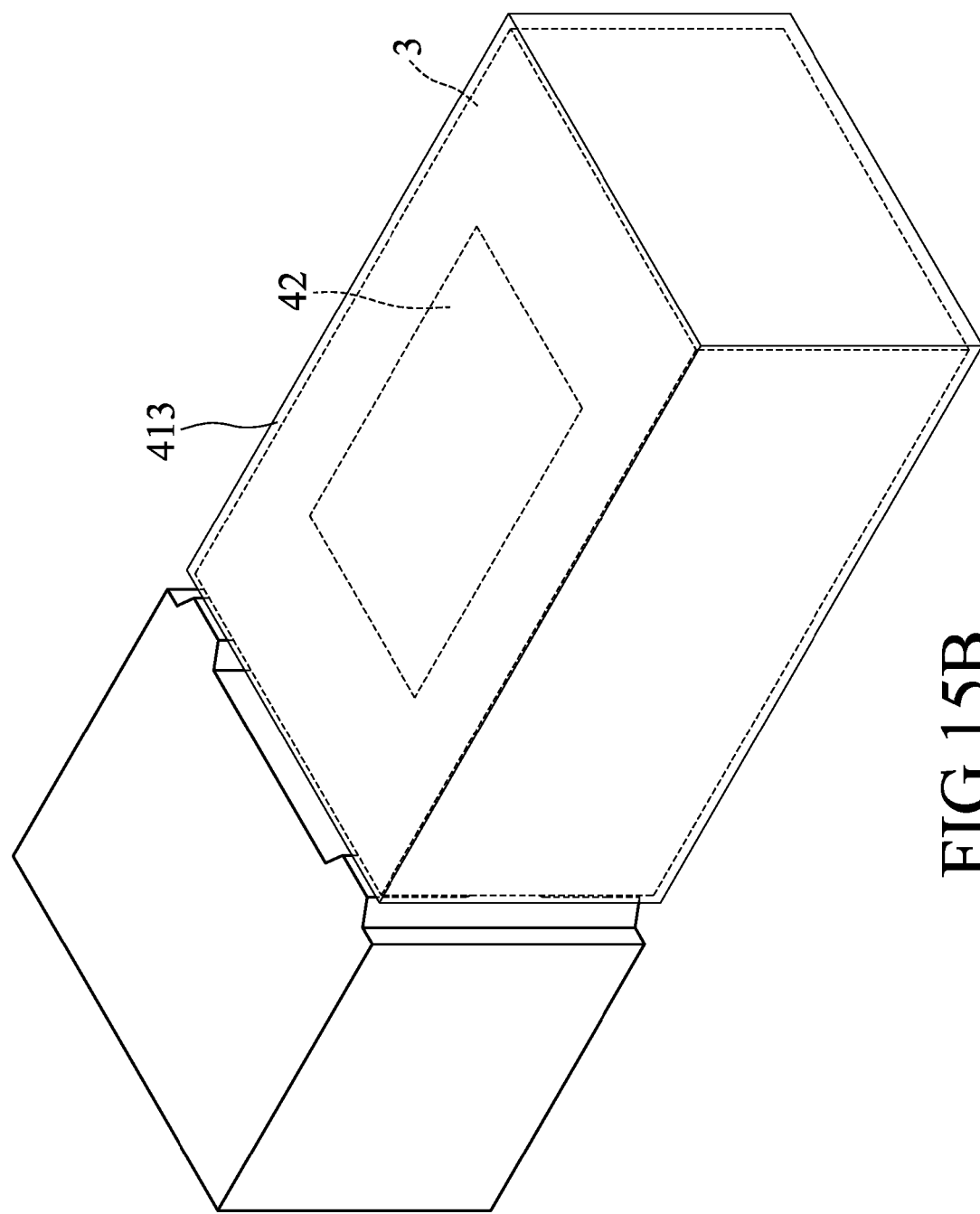
Figure 15C:
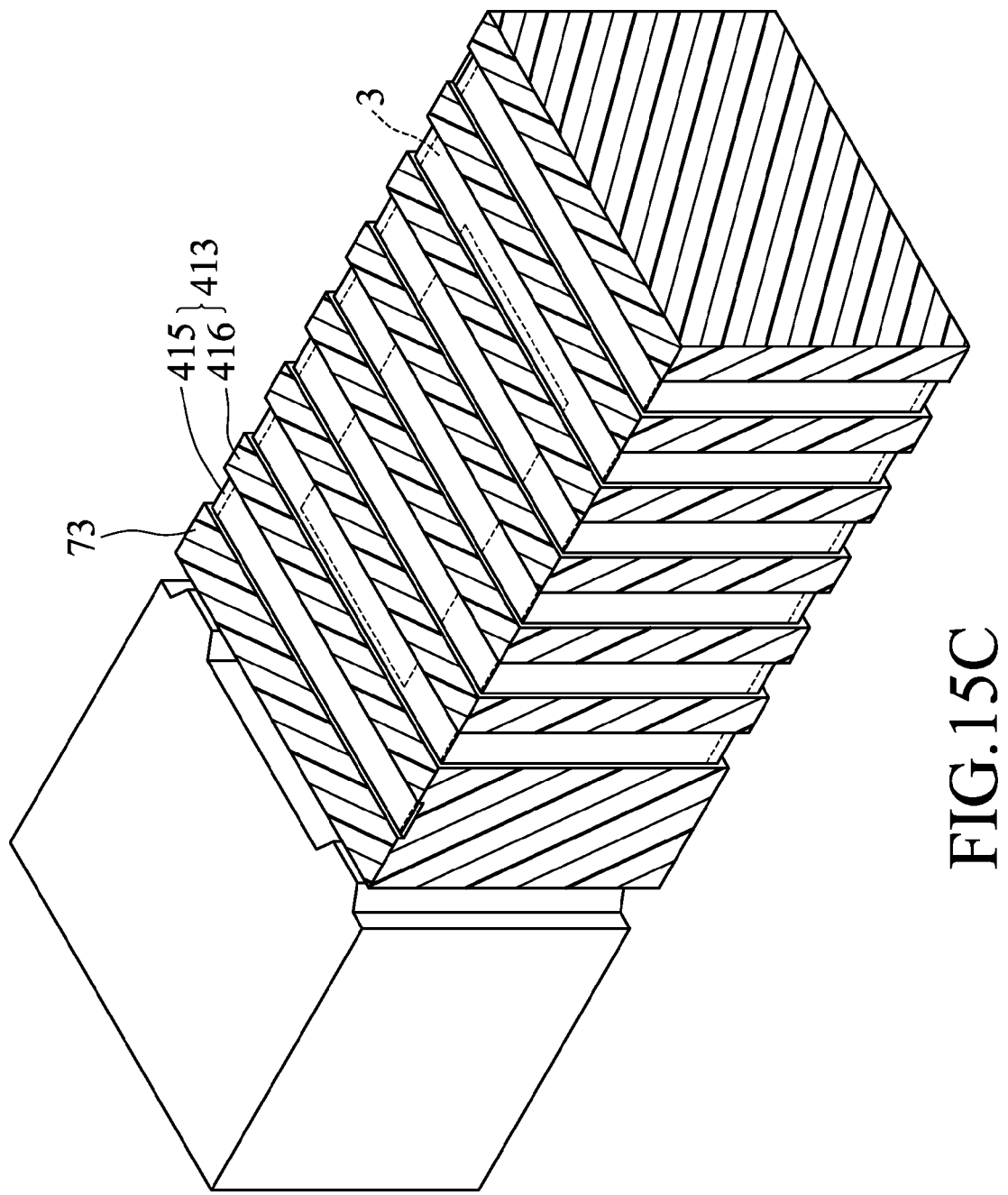
Figure 15D:
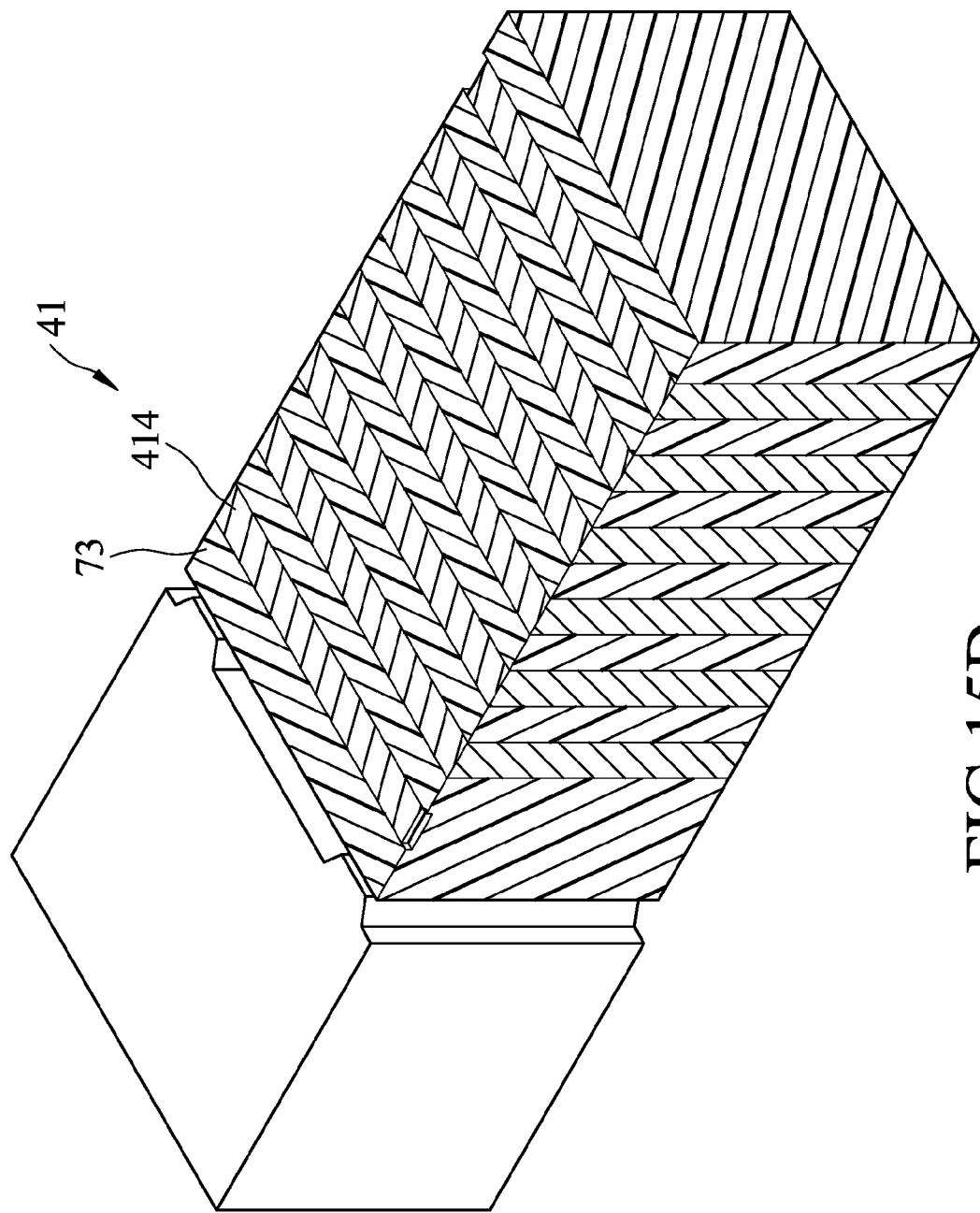
Figure 15E:
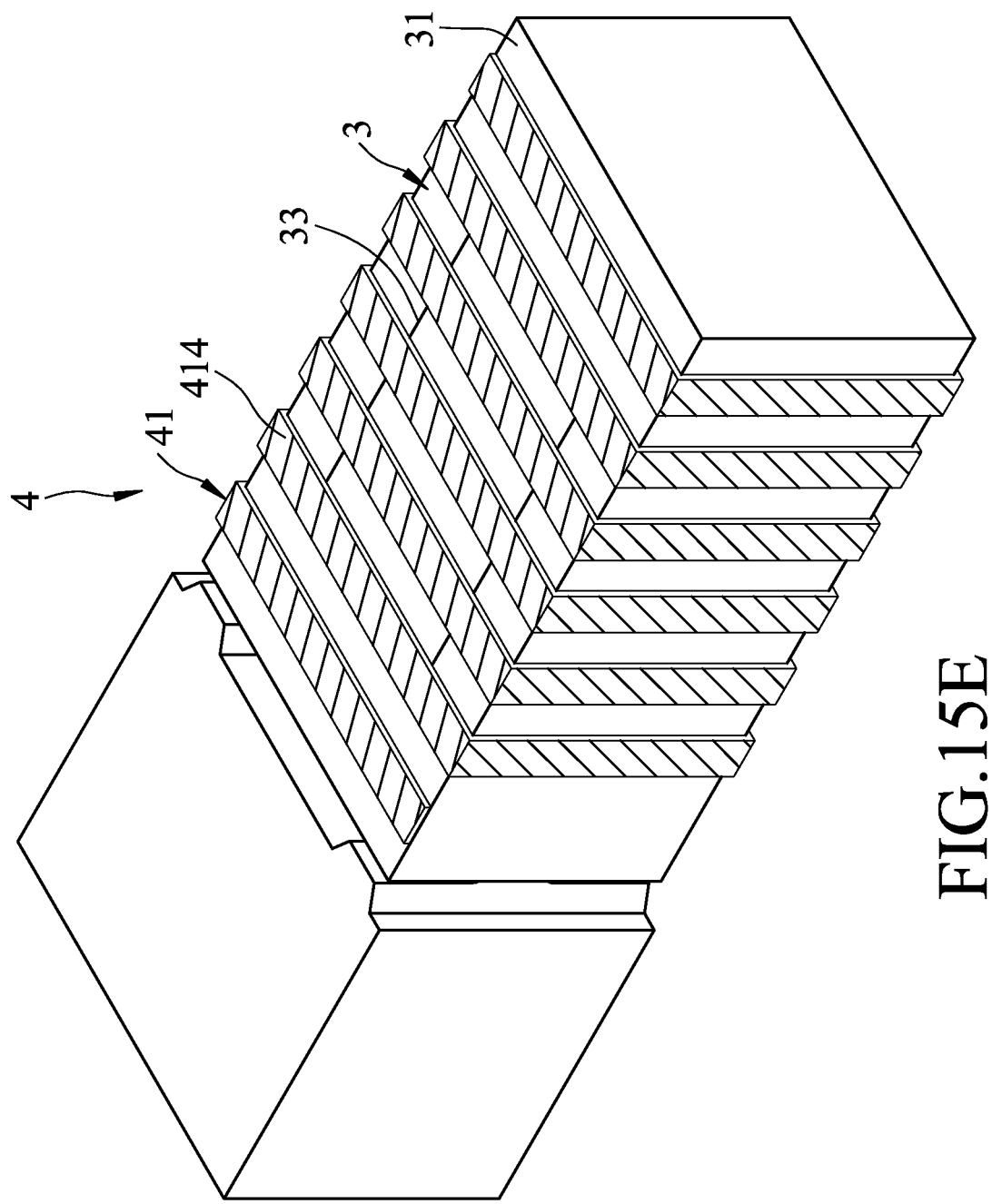

Referring to FIGS. 12 to 14, in step S1, two first patterned photoresist layers (not shown) are respectively formed on top and bottom surfaces (not shown) of a wafer (not shown), such that each of the top and bottom surfaces of the wafer has wider exposed regions and narrow exposed regions (not shown) which are exposed from the respective first patterned photoresist layer. The narrow exposed regions have an etching rate less than those of the wider exposed regions. The wafer is subsequently patterned using an etching process so as to form a patterned wafer 61. The patterned wafer 61 has a peripheral end portion 610, and at least one passive-component unit 611 that includes a connecting portion 6111, a breaking line 6112, and a plurality of the chip bodies 3 that are spaced apart from one another. The connecting portion 6111 is connected to the peripheral end portion 610. The breaking line 6112 has a plurality of connecting tabs 6114 that are spaced apart from one another and that correspond in position to respective ones of the narrow exposed regions of the wafer. Each of the connecting tabs 6114 is disposed between and interconnects the connecting portion 6111 and a respective one of the chip bodies 3.

Each of the chip bodies 3 has a structure as shown in FIG. 6.

In certain embodiments, the wafer may be made from quartz. A metal protecting film (not shown) is needed to be formed on each of the wafer at least at a portion where the chip bodies 3 are to be formed before forming the patterned wafer 61, so as to prevent the chip bodies 3 from being damaged.

In this embodiment, each of the connecting tabs 6114 is reduced in width from the connecting portion 6111 toward the respective one of the chip bodies 3. Each of the connecting tabs 6114 has a thickness less than that of the connecting portion 6111 and that of the chip bodies 3. In certain embodiment, the thickness of the connecting tabs 6114 maybe further reduced by a scriber.

In step S2 (see FIGS. 15A to 15E), the first functional layered structure 4 is formed on each of the chip bodies 3.

In this embodiment, the forming process of the first functional layered structure 3 in step S2 includes sub-steps of S21 to S25.

In sub-step S21 (see FIG. 15A), a magnetic ceramic powder is compounded with an organic solvent and a binder, so as to form a magnetic ceramic green which is in the form of a paste. The magnetic ceramic green is disposed in and fills the first recess 33 and is subsequently cured, such that the organic solvent is volatilized and the binder is solidified, so as to form the first magnetic layer 42 which is disposed within the recess 33 and which is bonded to the recess-defining surface (not shown). The magnetic ceramic powder may be made from $Fe_3O_4$ with an inverse spinel structure.

In sub-step S22 (see FIG. 15B), a seed layer 413 is formed on each of the chip bodies 3 and the corresponding first magnetic layer 42.

In sub-step S23 (see FIG. 15C), a second patterned photoresist layer 73 is formed on the seed layer 413, such that the seed layer 413 has an exposed region 415 that is exposed from the second patterned photoresist layer 73, and a covered region 416 that is covered with the second patterned photoresist layer 73.

In sub-step S24 (see FIG. 15D), a metal layer 414 is electroplated on the exposed region 415 of the seed layer 413 so as to form the first conductive layer 41 on and around each of the chip bodies 3 of the patterned wafer 61.

In sub-step S25 (see FIG. 15E), the second patterned photoresist layer 73 and the covered region 416 of the seed layer 413 are removed from the patterned wafer 61.

Preferably, the seed layer 413 may be made from a catalytically active material selected from the group consisting of Pt, Pd, Au, Ag and Cu, or a conductive material. When the seed layer 413 is made from the catalytically active material, the metal layer 414 is formed through chemical plating (or electroless plating) techniques. When the seed layer 413 is made from the conductive material, the metal layer 414 is formed through electro-plating techniques. In the embodiment, the seed layer 413 is deposited on each of the chip bodies 3 through electro-plating techniques.

In certain embodiments, a protecting layer (not shown) may be formed on the first conductive layer 41 after the formation of the first conductive layer 41, so as to isolate the first conductive layer 41 from atmospheric moisture or oxygen.

The first magnetic layer 42 may be made from magnetic metal powders, such as Fe, Co or Ni, instead of the magnetic ceramic powder. When the first magnetic layer 42 is made from the magnetic metal powder, an isolation layer (not shown) is needed to be formed on the first magnetic layer 42 before the formation of the first conductive layer 41 so as to prevent the first functional layered structure 4 from short circuit.

In step S3 (see FIG. 16), the patterned wafer 61 is broken along the breaking line 6112 by applying an external force thereto so as to form a plurality of embedded passive chip devices.

Figure 17:
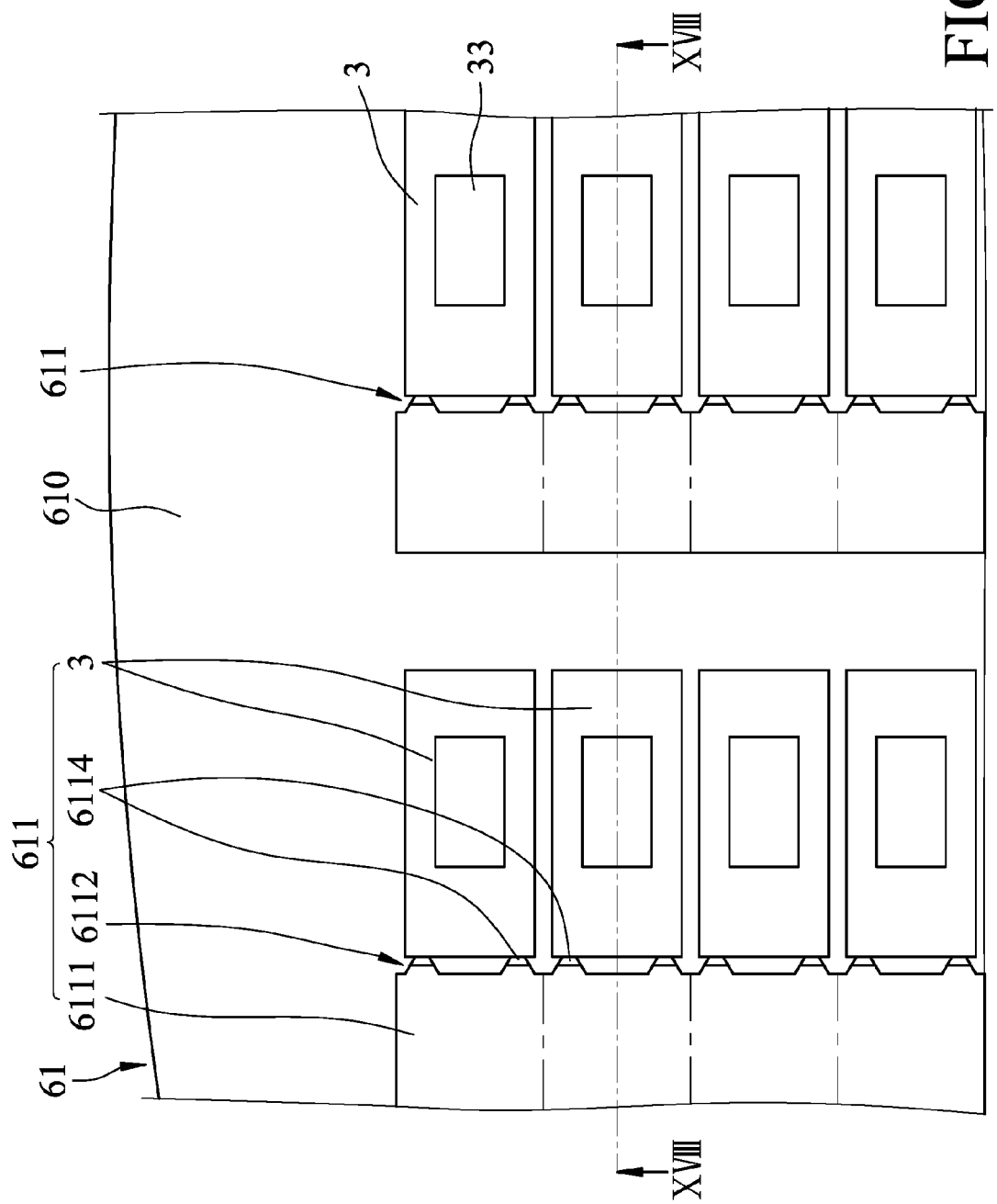
FIG. 17 is a fragmentary top view illustrating a step of a method of making the second embodiment of the embedded passive chip device according to the disclosure.
Figure 18A:
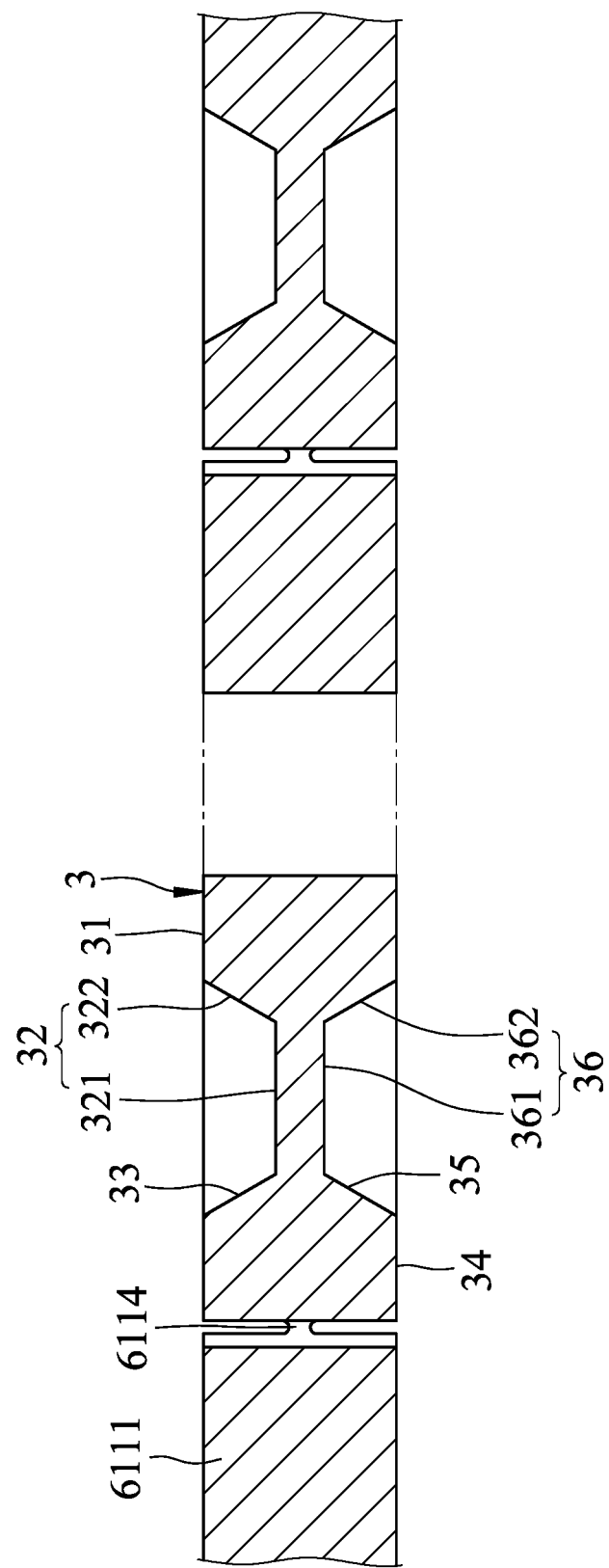
FIGS. 18A to 18C are perspective views illustrating consecutive steps of the method of making the second embodiment of the embedded passive chip device according to the disclosure.
Figure 18B:
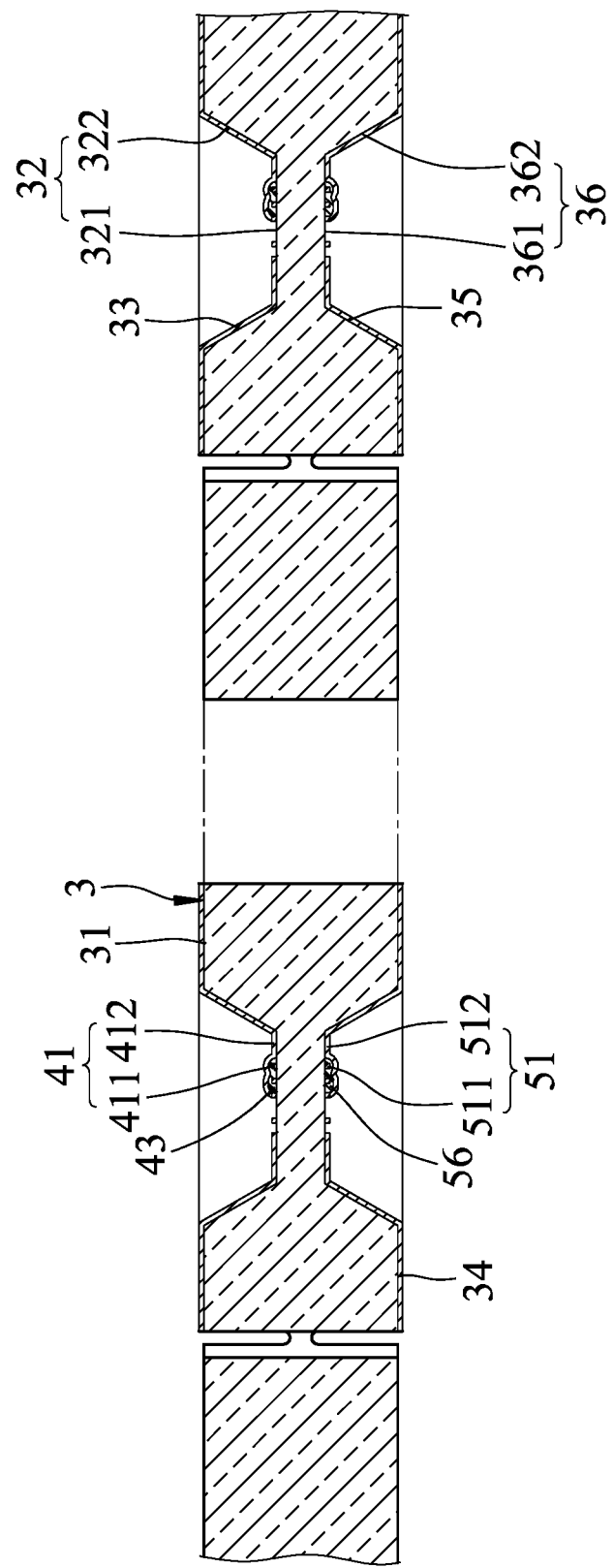
Figure 18C:
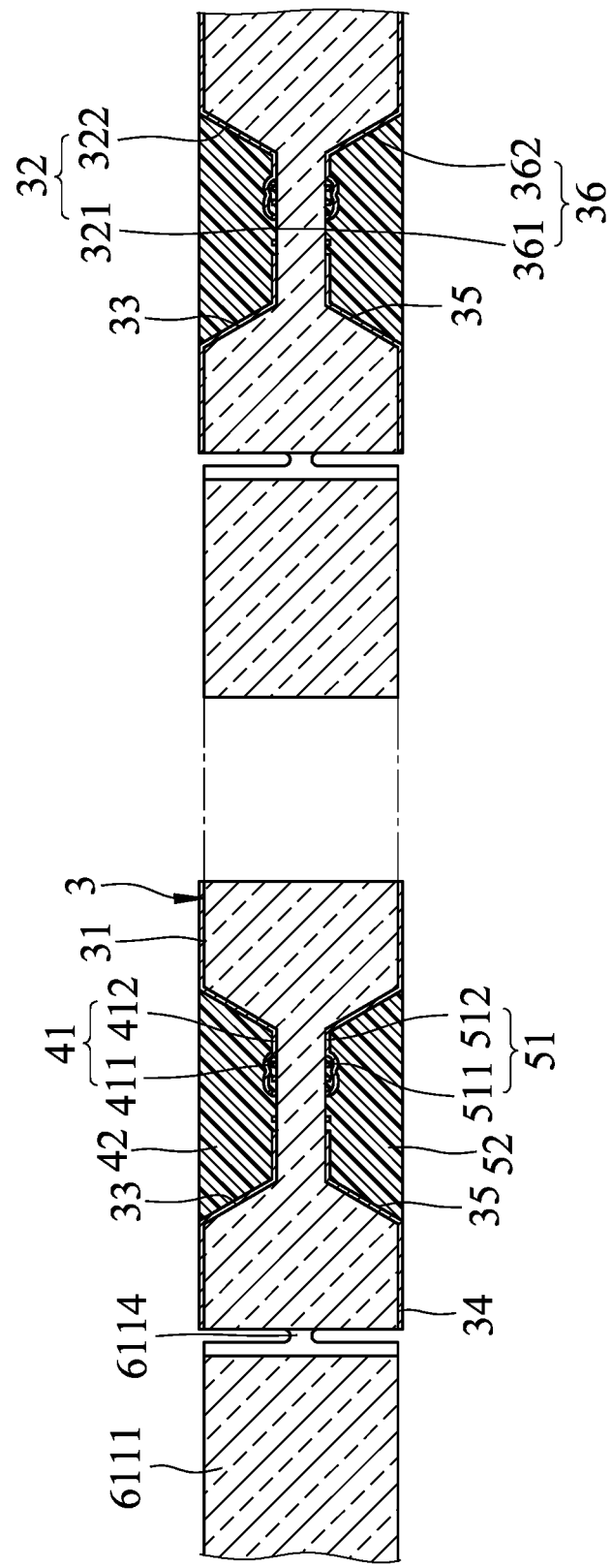

Referring to FIGS. 17 to 18(C), the method of making the embedded passive chip device of the second embodiment differs from the method of making the first embodiment in the formation of the first functional layered structure 4. In addition, the method further includes forming the second functional layered structure 5.

In this embodiment, the first and second functional layered structures 4, 5 are formed by the following steps.

As shown in FIGS. 17 and 18A, the wafer (not shown) is patterned using etching techniques, such that each of the chip bodies 3 of the patterned wafer 61 is formed with the first and second recess 33, 35.

As shown in FIG. 18B, the first and the second conductive layers 41, 51 are respectively formed on the first and second recess-defining surfaces 32, 36 through deposition techniques.

As shown in FIG. 18C, the first and second magnetic layers 42, 52 are respectively formed on the first and the second conductive layers 41, 51 such that the same are embedded in the first and second recesses 33, 35.

Referring to FIGS. 19A to 19EF, the method of making the embedded passive chip device of the third embodiment differs from the method of making the second embodiment in that, after forming the first and second magnetic layers 42, 52, the first and second capacitors are subsequently formed.

Figure 19A:
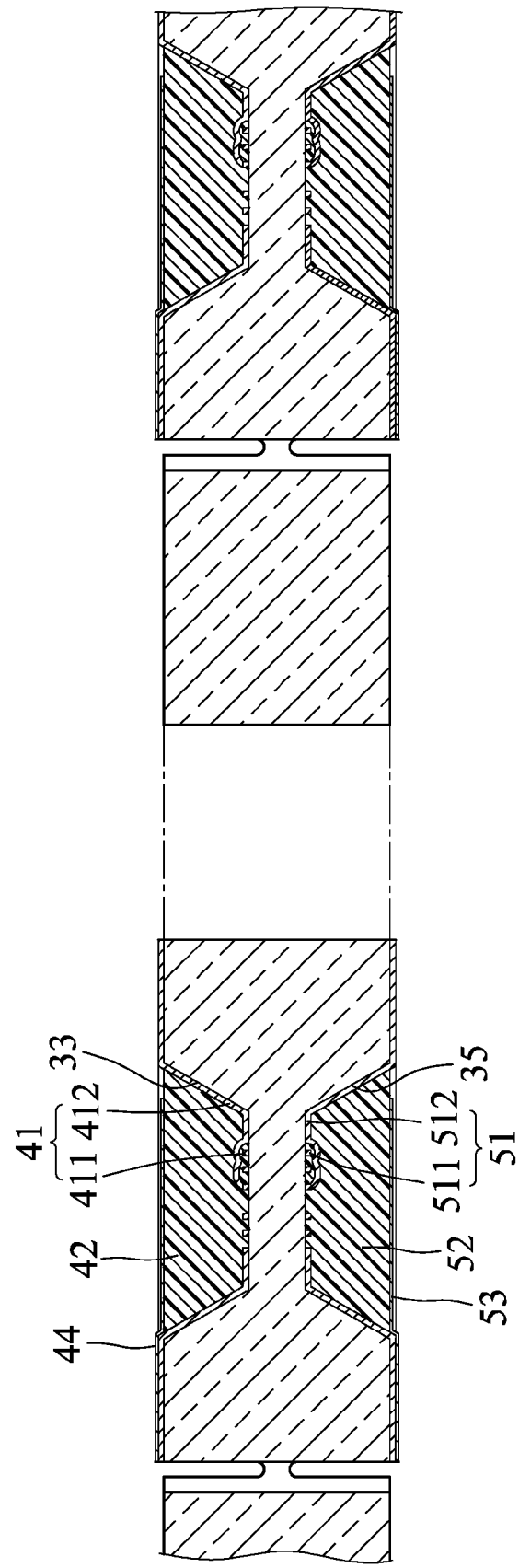
FIGS. 19A to 19C are perspective views illustrating consecutive steps of the method of making the third embodiment of the embedded passive chip device according to the disclosure.

As shown in FIG. 19A, the first electrode layer 44 and the third electrode layer 53 are respectively formed on the first and second magnetic layers 42, 52 through deposition techniques.

Figure 19B:
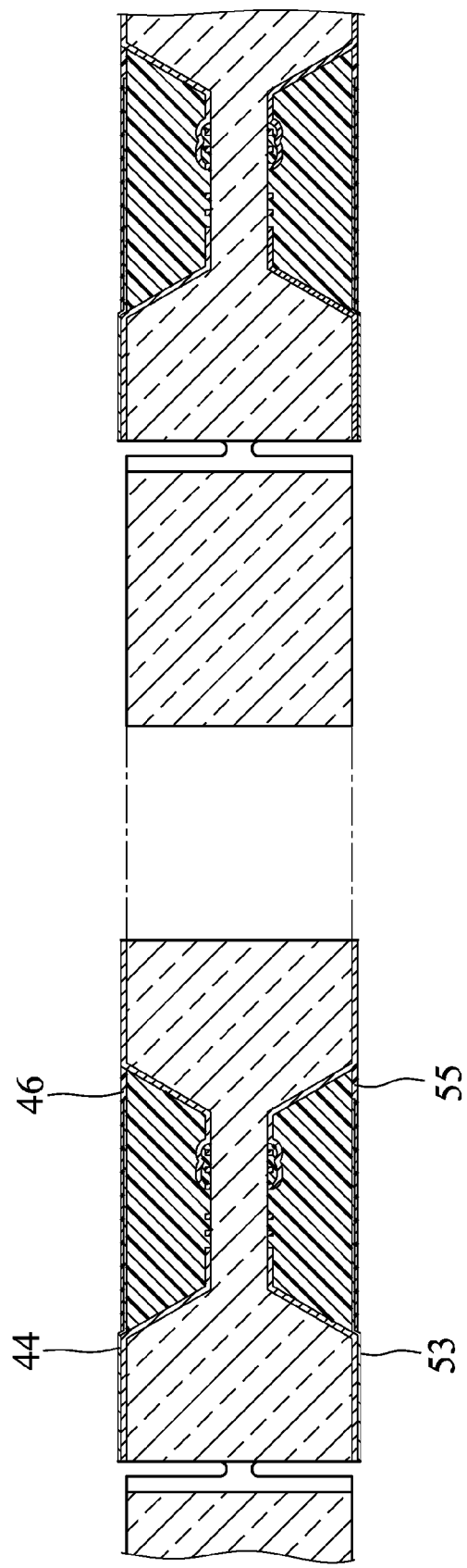

As shown in FIG. 19B, the first and second dielectric layers 46, 55 are respectively formed on the first electrode layer 44 and the third electrode layer 53.

Figure 19C:
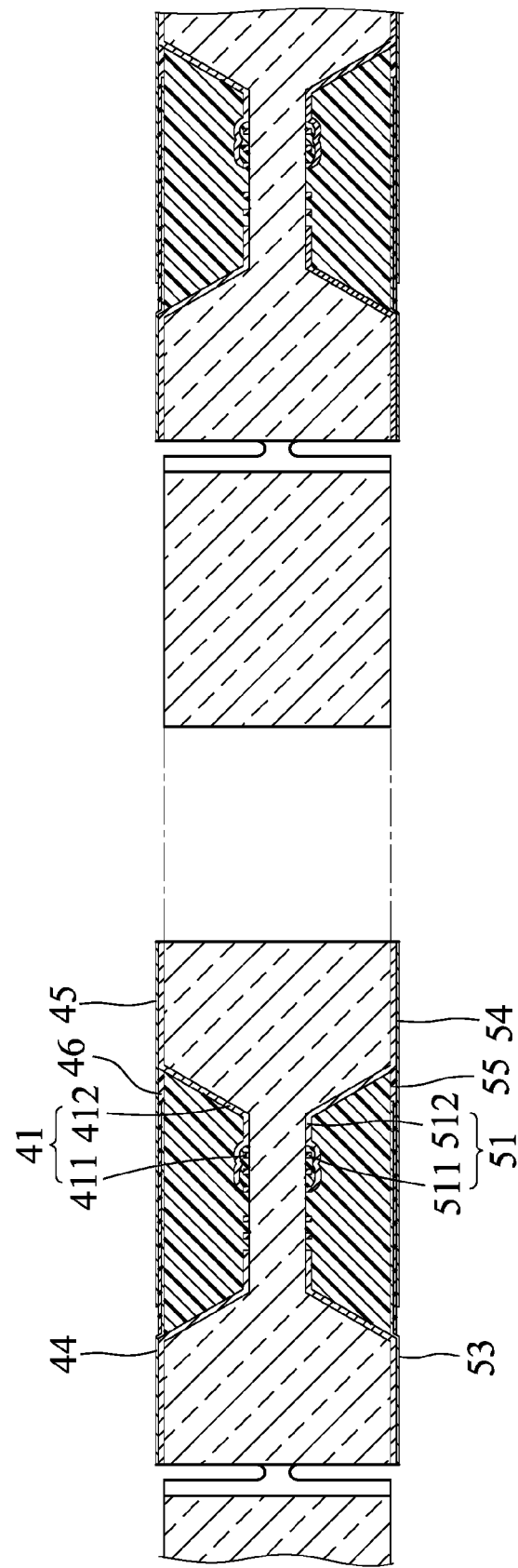

As shown in FIG. 19C, the second electrode layer 45 and the forth electrode layer 54 are respectively formed on the first and second dielectric layers 46, 55 through deposition techniques.

In summary, the method of making the embedded passive chip device of the present disclosure may be advantageous over the prior art in reducing the steps of making the passive device.

Furthermore, the chip body 3 of the embedded passive chip device of the present disclosure is in the form of a single piece. As such, the chip body 3 of the embedded passive chip device of the present disclosure has a higher mechanical strength than that of the conventional multilayered type passive device. In addition, the size of the embedded passive chip device of the present disclosure can range from hundreds of micrometers to hundreds of millimeters.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method of making an embedded passive chip device comprising:

forming a patterned wafer which has a peripheral end portion and at least one passive-component unit that includes a connecting portion, a breaking line, and a plurality of spaced apart chip bodies, the connecting portion being connected to the peripheral end portion, the breaking line having a plurality of connecting tabs that are spaced apart from one another, each of the connecting tabs being disposed between and interconnecting the connecting portion and a respective one of the chip bodies, each of the chip bodies having a circuit-forming surface that is formed with a recess;

forming a functional layered structure on each of the chip bodies, the functional layered structure including a conductive layer that has at least a portion which covers at least partially the circuit-forming surface, and a magnetic layer that is disposed within the recess and that is inductively coupled to the conductive layer for generating inductance; and breaking the patterned wafer along the breaking line by applying an external force thereto so as to form a plurality of embedded passive chip devices.

2. The method of claim 1, wherein each of the connecting tabs is reduced in width from the connecting portion toward the respective one of the chip bodies, each of the connecting tabs having a thickness less than that of the connecting portion and that of the chip bodies.

3. The method of claim 1, the formation of the conductive layer of the functional layered structure on each of the chip bodies is conducted by:

forming a seed layer on each of the chip bodies after formation of the magnetic layer, such that the seed layer is disposed on and around each of the chip bodies;

forming a patterned photoresist layer on the seed layer on each of the chip bodies, such that the seed layer has a exposed region that is exposed from the patterned photoresist layer, and a covered region that is covered with the patterned photoresist layer;

depositing a metal layer on the exposed region of the seed layer so as to form a conductive layer on and around each of the chip bodies through plating techniques; and removing the covered region of the seed layer.

4. The method of claim 3, wherein the seed layer is made from a catalytically active material, and the plating techniques is chemical plating.

5. The method of claim 3, wherein the seed layer is made from a conductive material, and the plating techniques is electroplating.

6. The method of claim 1, wherein the recess is defined by a recess-defining surface that has a base portion and a surrounding portion which is disposed between and interconnects the base portion and the first circuit-forming surface, the conductive layer having a spiral part that is formed on the base portion, and an extending part that extends from the spiral part and that further extends on and contacts the surrounding portion and the circuit-forming surface, the functional layered structure on each of the chip bodies further including:

an insulator layer that is formed on the base portion and that covers a portion of the spiral part, the extending part further extending on the insulator layer;
a first electrode layer formed on the magnetic layer;
a dielectric layer formed on the first electrode layer; and
a second electrode layer formed on the dielectric layer, the first and second electrode layers and the dielectric layer cooperatively defining a capacitor, the extending part being electro-connected to one of the first and second electrode layers.

* * * * *